United States Patent
Shimomura et al.

(10) Patent No.: US 8,472,242 B2
(45) Date of Patent: Jun. 25, 2013

(54) MAGNETORESISTIVE EFFECT MEMORY

(75) Inventors: Naoharu Shimomura, Tokyo (JP); Eiji Kitagawa, Yokohama (JP); Sumio Ikegawa, Yokohama (JP); Yoshihisa Iwata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 448 days.

(21) Appl. No.: 12/748,785

(22) Filed: Mar. 29, 2010

(65) Prior Publication Data

US 2010/0246244 A1     Sep. 30, 2010

(30) Foreign Application Priority Data

Mar. 30, 2009 (JP) .................. 2009-083347

(51) Int. Cl.
*G11C 11/14* (2006.01)
(52) U.S. Cl.
USPC .......................... 365/171; 365/158
(58) Field of Classification Search
USPC ......................... 365/158, 171, 173
See application file for complete search history.

(56) References Cited

U.S. PATENT DOCUMENTS

| | | | |
|---|---|---|---|
| 6,760,244 B2 * | 7/2004 | Yamada ........................... | 365/63 |
| 7,633,699 B2 * | 12/2009 | Kaka et al. ...................... | 360/67 |
| 7,872,906 B2 * | 1/2011 | Miura et al. .................. | 365/158 |
| 2008/0043519 A1 | 2/2008 | Kitagawa et al. | |

FOREIGN PATENT DOCUMENTS

| | | |
|---|---|---|
| JP | 2004-171730 | 6/2004 |
| JP | 2007-134027 | 5/2007 |
| JP | 2007-311514 | 11/2007 |
| JP | 2008-28362 | 2/2008 |
| JP | 2008-47257 | 2/2008 |

OTHER PUBLICATIONS

Hiroyuki Tomita, et al., "Single-Shot Measurements of Spin-Transfer Switching in CoFeB/MgO/CoFeB Magnetic Tunnel Junctions," Applied Physics Express, vol. 1, 061303 (2008), pp. 1-3.
Z. Li, et al., "Thermally assisted magnetization reversal in the presence of a spin-transfer torque," Physical Review B, vol. 69, 134416 (2004), pp. 1-6.
Office Action issued Aug. 2, 2011 in Japanese Patent Application No. 2009-083347 (with English translation).
Office Action issued Mar. 5, 2013, in Japanese Patent Application No. 2012-000698, (with English-language Translation).

* cited by examiner

*Primary Examiner* — Tuan T Nguyen
*Assistant Examiner* — Lance Reidlinger
(74) *Attorney, Agent, or Firm* — Oblon, Spivak, McClelland, Maier & Neustadt, L.L.P.

(57) ABSTRACT

A magnetoresistive effect memory of an aspect of the present invention including a magnetoresistive effect element including a first magnetic layer having an invariable magnetization direction, a second magnetic layer having a variable magnetization direction, and an interlayer provided between the first magnetic layer and the second magnetic layer, and a reading circuit which passes a pulse-shaped read current through the magnetoresistive effect element to read data stored in the magnetoresistive effect element, wherein the pulse width of the read current is shorter than a period from an initial state to a cooperative coherent precession movement of magnetizations included in the second magnetic layer.

19 Claims, 20 Drawing Sheets

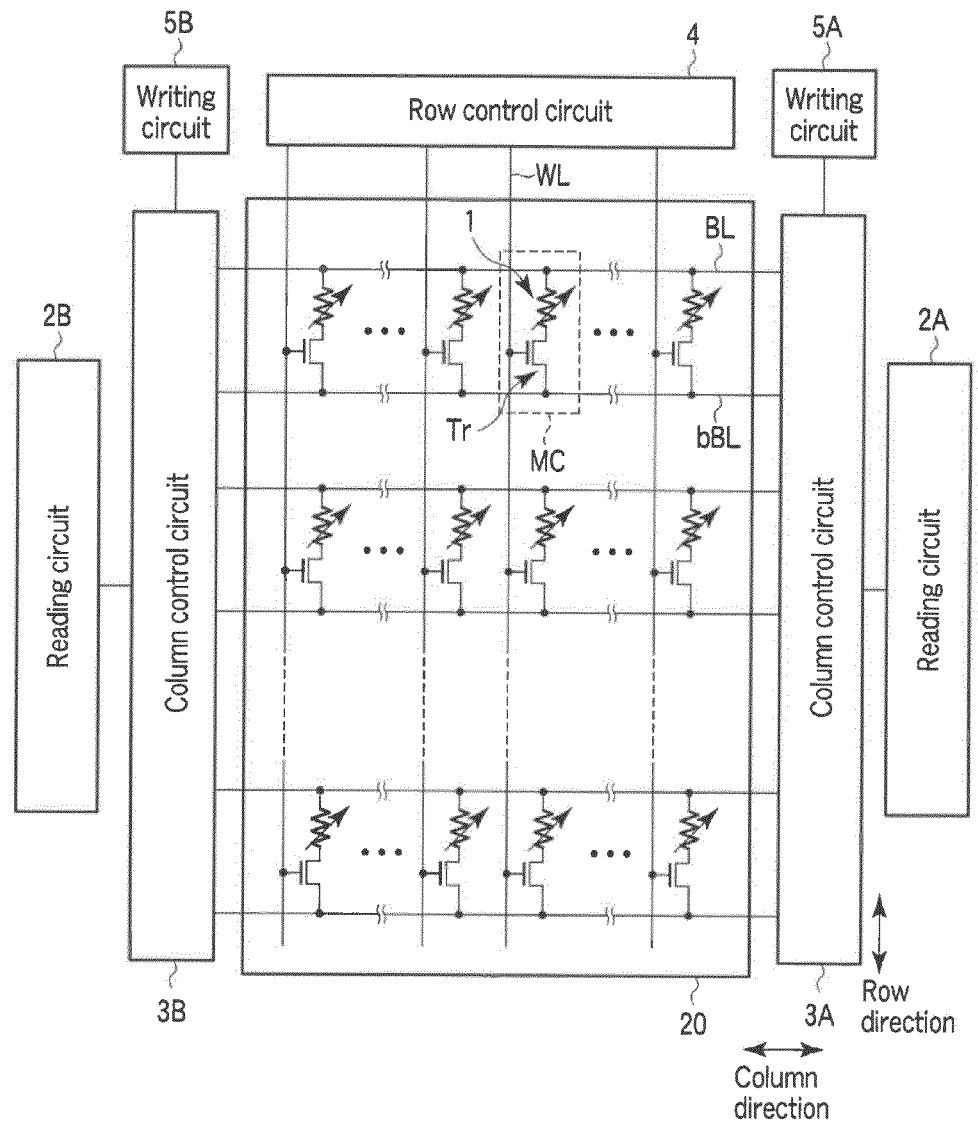
F I G. 15

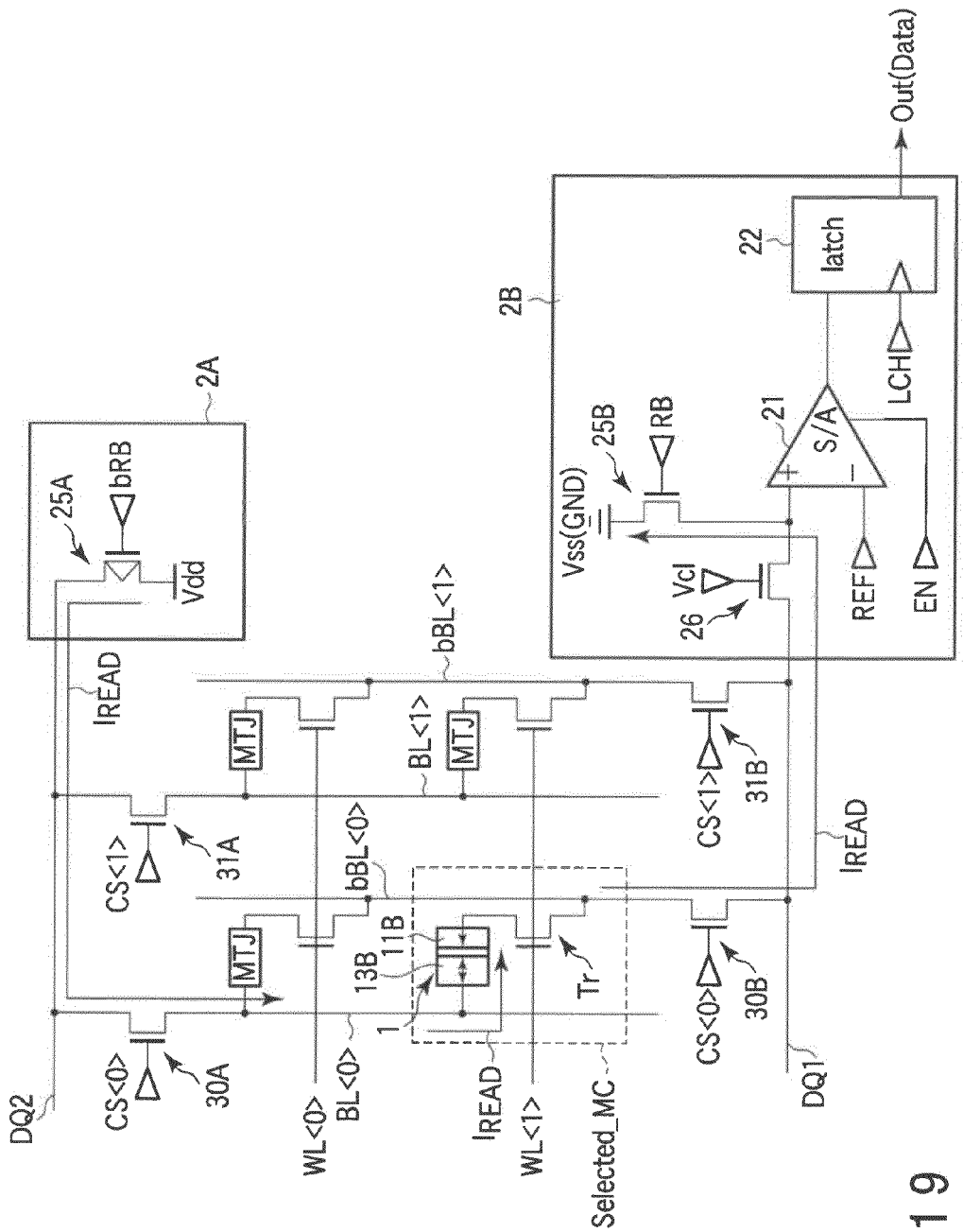
F I G. 19

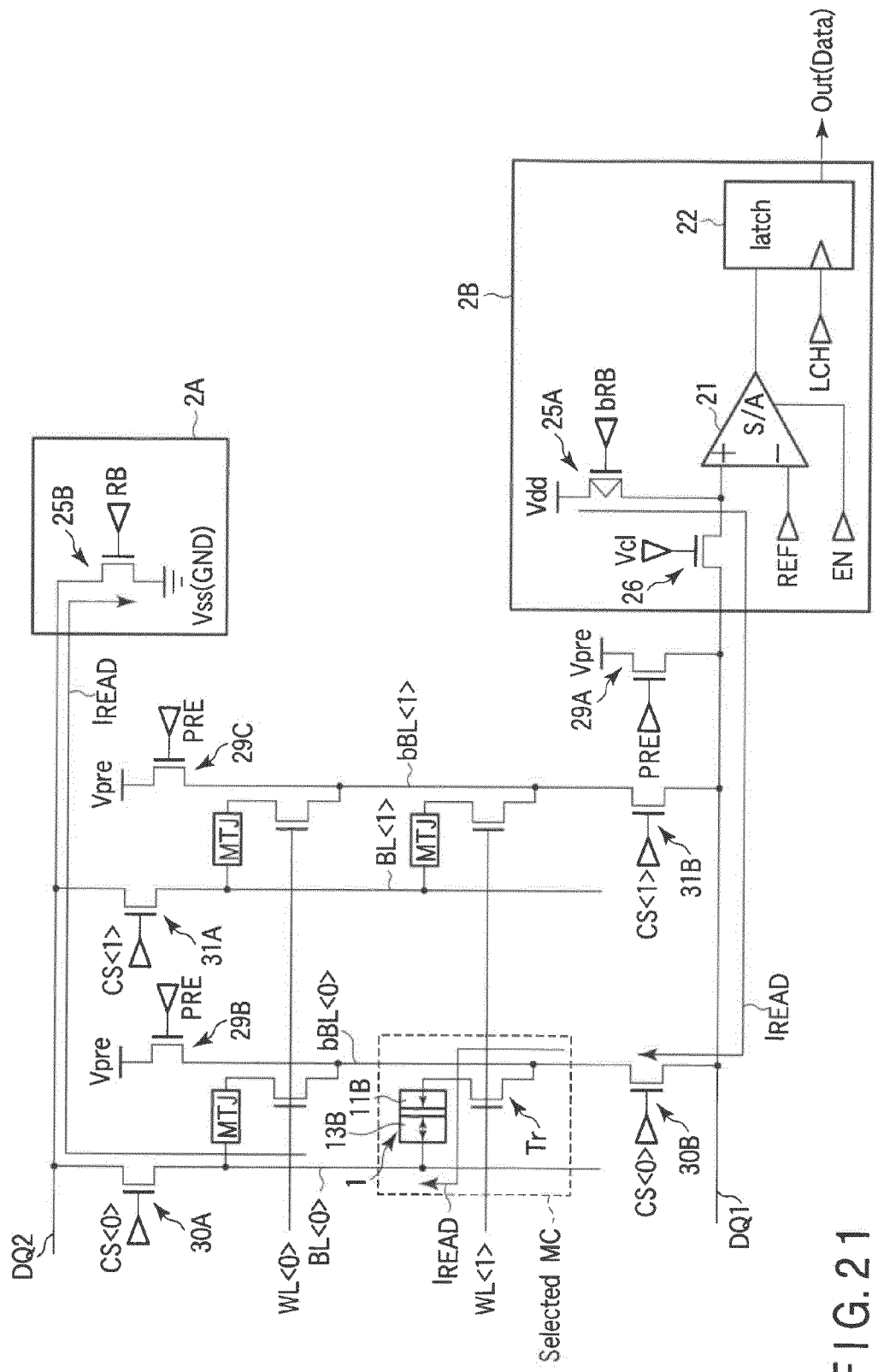
F I G. 21

MAGNETORESISTIVE EFFECT MEMORY

CROSS-REFERENCE TO RELATED APPLICATIONS

This application is based upon and claims the benefit of priority from prior Japanese Patent Application No. 2009-083347, filed Mar. 30, 2009, the entire contents of which are incorporated herein by reference.

BACKGROUND OF THE INVENTION

1. Field of the Invention

The present invention relates to a magnetoresistive effect memory using a magnetoresistive effect element.

2. Description of the Related Art

Various types of magnetoresistive effect memories have heretofore been proposed. Recently, a magnetoresistive effect memory using a ferromagnetic tunnel junction element that shows a tunneling magnetoresistive (TMR) effect, such as a magnetoresistive random access memory (MRAM), has been attracting attention. As a TMR effect element, a magnetic tunnel junction (MTJ) element that uses the change of magnetic resistance caused by a spin-polarized tunneling effect is generally used. The MTJ element assumes a low resistance state or a high resistance state in accordance with the relative magnetization arrangement of two ferromagnetic layers, and stores data by matching "0" or "1" to this resistance state.

One method of writing data in the magnetoresistive effect memory is a spin transfer writing method that uses the spin torque of a current (electrons) to change the direction of the magnetization of a magnetic layer. In the spin transfer writing method, a write current equal to or more than a certain current value is passed through the MTJ element. Then, the relative magnetization arrangement of two ferromagnetic layers constituting the MTJ element is changed from a parallel state to an antiparallel state or from an antiparallel state to a parallel state in accordance with the direction in which the write current runs through the MTJ element, whereby data is written. When data is read from the magnetoresistive effect memory, the data is identified by using a resistance difference between the high resistance state and low resistance state of the MTJ element. In reading data, a current (read current) is directly passed through the MTJ element as in the case of data writing.

For example, as described in Z. Li and S. Zhang, Physical Review B, Vol. 69, 134416 (2004) (hereinafter referred to as Reference 1), it has been considered that the probability of magnetization inversion of the MTJ element attributed to spin transfer can be indicated by a simple thermally-activated process which is represented by (Expression 1):

$$P(\tau) = 1 - \exp\left[-\tau f \exp\left\{-\frac{\Delta E_a}{k_B T}\left(1 - \frac{I}{I_{c0}}\right)\right\}\right] \quad \text{(Expression 1)}$$

In the magnetization inversion model represented by (Expression 1), the probability $(1-P(\tau))$ that magnetization is not inverted by the spin transfer exponentially decreases with respect to time $\tau$ of current supply to the MTJ element. Moreover, in the model represented by (Expression 1), magnetization is inverted by the spin transfer with a finite probability immediately after the supply of a pulse current, that is, even in an extreme case where the pulse width $\tau$ of a current is directed to 0.

On the other hand, according to H. Tomita et al., Applied Physics Express, Vol. 1 (2008) 061303 (hereinafter referred to as Reference 2), there is a period of time in which a probability of the magnetization inversion is nearly zero immediately after the supply of a current to the MTJ element is started, and after this given length of time, the probability of the magnetization inversion increases, as represented by (Expression 2) and (Expression 3):

$$P(t)=0 \, (t<t_0) \quad \text{(Expression 2)}$$

$$P(t)=1-\exp\left[-(t-t_0)/\tau\right](t \geq t_0) \quad \text{(Expression 3)}$$

In a spin-transfer-type MRAM, the value of a write current is set at a current value higher than a threshold (hereinafter referred to as an inversion threshold) at which magnetization is inverted by spin transfer. The value of a read current is set at a current value lower than the inversion threshold.

However, the inversion threshold also varies due to characteristic variations of MTJ elements constituting a memory cell array. Moreover, when data is repeatedly written into the same element, there is a phenomenon in which the inversion threshold of this element fluctuates.

Therefore, when the value of the read current is set close to the average of the inversion thresholds in the memory cell array, the magnetization of the MTJ element having a low inversion threshold is erroneously inverted by the read current, and read disturb may occur.

In order to prevent the occurrence of the read disturb, the value of a read current has to be much lower than the inversion threshold. However, if the value of the read current is lower, a read signal (the potential variation of a bit line) is smaller, and sufficient reading sensitivity is not obtained.

BRIEF SUMMARY OF THE INVENTION

A magnetoresistive effect memory of an aspect of the present invention comprising: a magnetoresistive effect element including a first magnetic layer having an invariable magnetization direction, a second magnetic layer having a variable magnetization direction, and an interlayer provided between the first magnetic layer and the second magnetic layer; and a reading circuit which passes a pulse-shaped read current through the magnetoresistive effect element to read data stored in the magnetoresistive effect element, wherein the pulse width of the read current is shorter than a period from an initial state to a cooperative coherent precession movement of magnetizations included in the second magnetic layer.

A magnetoresistive effect memory of an aspect of the present invention comprising: a magnetoresistive effect element including a first magnetic layer having an invariable magnetization, a second magnetic layer having a variable magnetization, and an interlayer provided between the first magnetic layer and the second magnetic layer; and a reading circuit which passes a pulse-shaped read current through the magnetoresistive effect element to identify data stored in the magnetoresistive effect element, wherein the density of the read current is 0.9 times or less of a predetermined current density and the pulse width of the read current is 8 nsec or less, the predetermined current density has 0.5 of the magnetization inversion probability of the magnetoresistive effect element when a current having a pulse width of 10 nsec is used to write data into the magnetoresistive effect element.

A magnetoresistive effect memory of an aspect of the present invention comprising: a magnetoresistive effect element including a first magnetic layer having an invariable magnetization, a second magnetic layer having a variable magnetization, and an interlayer provided between the first magnetic layer and the second magnetic layer; and a reading circuit which passes a pulse-shaped read current through the magnetoresistive effect element to identify data stored in the magnetoresistive effect element, wherein a pulse width $T_p$ satisfies Conditional expression (i):

$$T_p \leq \frac{A}{\frac{J_{read}}{J_C(10 \text{ nsec, midpoint})} - B} \quad (i)$$

where $T_p$ is the pulse width of the read current, $J_{read}$ is the density of the read current, $J_C$ (10 ns, midpoint) is a predetermined current density, A is a first value using a read disturb occurrence probability as a parameter, and B is a second value using the read disturb occurrence probability as a parameter, the predetermined current density has 0.5 of the magnetization inversion probability of the magnetoresistive effect element when a current having a pulse width of 10 nsec is used to write data into the magnetoresistive effect element.

BRIEF DESCRIPTION OF THE SEVERAL VIEWS OF THE DRAWING

FIG. 15 is a diagram showing an application of the magnetoresistive effect memory according to the present embodiment;

FIGS. 17A, 17B, 18 and 19 are diagrams showing an example of the configuration of a reading circuit used in the memory according to the application;

FIG. 21 is a diagram showing an example of the configuration of a reading circuit used in the memory according to the application;

DETAILED DESCRIPTION OF THE INVENTION

Hereinafter, an embodiment of the present invention will be described in detail with reference to the drawings.

[Embodiment]

A magnetoresistive effect memory according to the embodiment of the present invention is described with FIGS. 1A to 6.

Figure 1A:
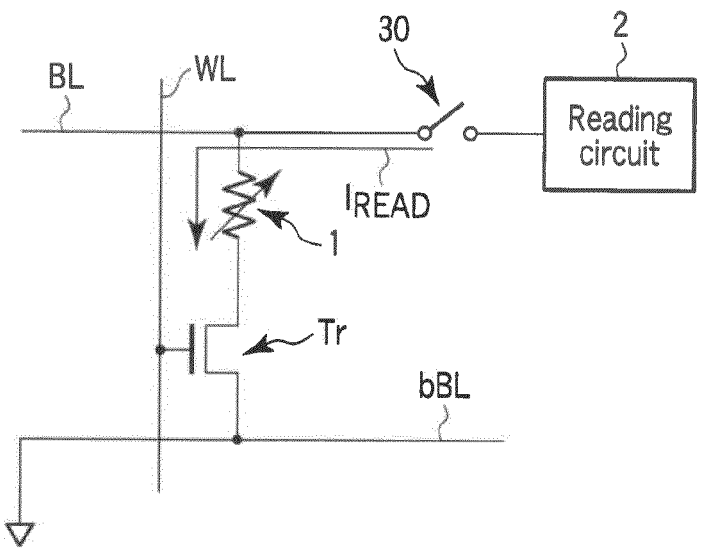
FIGS. 1A and 1B are diagrams illustrating a magnetoresistive effect memory according to an embodiment.

FIG. 1A shows an example of the configuration of a magnetoresistive effect memory according to the present embodiment.

As shown in FIG. 1A, a magnetoresistive effect element 1 is connected to two bit lines BL. One end of the magnetoresistive effect element 1 is connected to the bit line BL, and the other end of the magnetoresistive effect element 1 is connected to the bit line bBL via a switch Tr.

The switch Tr is, for example, a field effect transistor (FET). Hereinafter, the switch Tr is referred to as a select transistor Tr. One end (source/drain) of the current path of the select transistor Tr is connected to the other end of the magnetoresistive effect element 1, and the other end (source/drain) of the current path of the select transistor Tr is connected to the bit line bBL. A control terminal (gate) of the select transistor Tr is connected to a word line WL. The word line WL extends, for example, in a direction that intersects with the direction in which the bit lines BL, bBL extend.

FIGS. 2A and 2B are sectional views showing the configuration of one magnetoresistive effect element 1 included in the magnetoresistive effect memory according to the present embodiment. As the magnetoresistive effect element 1, a magnetic tunnel junction (MTJ) element that utilizes the change of magnetic resistance caused by a spin-polarized tunneling effect is used. Hereinafter, the magnetoresistive effect element 1 is referred to as an MTJ element.

The MTJ element 1 has a stack structure in which a reference layer (also referred to as a magnetization invariable layer) 11A, 11B, an interlayer (nonmagnetic layer) 12A, 12B and a storage layer (also referred to as a magnetization free layer) 13A, 13B are stacked in order. Note that the stacking order of reference layer 11A, 11B and the storage layer 13A, 13B may be reversed.

In the MTJ element 1 shown in FIG. 2A, the easy magnetization axes of the reference layer 11A and the storage layer 13A are parallel to the surface of the film. The MTJ element 1 shown in FIG. 2A is referred to as an in-plane magnetization type MTJ element.

In the MTJ element 1 shown in FIG. 2B, the easy magnetization axes of the reference layer 11B and the storage layer 13B are perpendicular to the surface of the film (or the surface of the stack). The MTJ element shown in FIG. 2B is referred to as a perpendicular magnetization type MTJ element.

An in-plane magnetization magnetic layer has a magnetic anisotropy in an in-plane direction, and a perpendicular magnetization magnetic layer has a magnetic anisotropy perpendicular to the film surface. The advantage of the use of a perpendicular magnetization type MTJ element as the MTJ element 1 is that there is no need to control the shape of the element to determine the magnetization direction in contrast with the in-plane magnetization type, which is suitable for miniaturization.

The magnetization (spin) direction of the storage layer 13A, 13B is variable (inverted). The magnetization direction of the reference layer 11A, 11B is invariable (fixed). The "invariable magnetization direction of the reference layer 11A, 11B" means that the magnetization direction (a magnetization of layer) of the reference layer 11A, 11B does not change when a magnetization inversion current (inversion threshold) used to invert the magnetization direction (a magnetization of a layer) of the storage layer 13A, 13B is passed through the reference layer 11A, 11B. Thus, in the MTJ element 1, a magnetic layer having a high inversion threshold is used as the reference layer 11A, 11B, and a magnetic layer having an inversion threshold lower than that of the reference layer 11A, 11B is used as the storage layer 13A, 13B, so that the MTJ element 1 which comprises the storage layer 13A, 13B variable in magnetization direction and the reference layer 11A, 11B invariable in magnetization direction can be obtained.

Furthermore, in order to fix the magnetization of the reference layer 11A, 11B, an antiferromagnetic layer (not shown) is provided adjacent to the reference layer 11A, 11B, and the magnetization direction of the reference layer 11A, 11B can be fixed by the exchange coupling of the reference layer 11A, 11B and the antiferromagnetic layer. However, in the perpendicular magnetization type MTJ element, the antiferromagnetic layer (not shown) need not be provided adjacent to the reference layer 11A. The planar shape of the MTJ element 1 is not particularly limited, and may be, for example, circular, elliptic, quadrate or rectangular. Alternatively, the planar shape of the MTJ element 1 may be a quadrate or rectangular shape with rounded or removed corners.

The reference layer 11A, 11B and the storage layer 13A, 13B are made of a magnetic material having high coercive force, and preferably have a high magnetic anisotropy energy density of, for example, $1 \times 10^6$ erg/cc or more.

The interlayer 12A, 12B is made of a nonmagnetic material. For example, an insulator, semiconductor or metal can be used for the interlayer 12A, 12B. When an insulator or semiconductor is used, the interlayer 12A, 12B is called a tunnel barrier layer.

In addition, each of the reference layer 11A, 11B and the storage layer 13A, 13B is not limited to the shown single layer, and may have a stack structure composed of a plurality of ferromagnetic layers. Alternatively, each of the reference layer 11A, 11B and the storage layer 13A, 13B may have an antiferromagnetically coupled structure which is composed of a first ferromagnetic layer, a nonmagnetic layer and a second ferromagnetic layer and which is magnetically coupled (exchange-coupled) so that the magnetization directions of the first and second ferromagnetic layers are antiparallel to each other. Alternatively, each of the layers may have a ferromagnetically coupled structure which is magnetically coupled (exchange-coupled) so that the magnetization directions of the first and second ferromagnetic layers are parallel to each other.

Furthermore, the MTJ element 1 may have a double junction structure. The MTJ element 1 of the double junction structure has a stack structure including a first reference layer, a first interlayer, a storage layer, a second interlayer and a second reference layer that are stacked in the above order. The advantage of such a double junction structure is that the magnetization inversion of the storage layer 13A, 13B caused by spin transfer is easily controlled.

A reading circuit 2, for example, is connected to the bit line BL. The reading circuit 2 includes a current source or a voltage source, and a sense amplifier. The reading circuit 2 outputs a read current $I_{READ}$ during read operation.

The reading circuit 2 is electrically disconnected from the bit line BL when a switch 30 is turned off. The reading circuit 2 is electrically connected to the bit line BL when the switch 30 is turned on. When data is read from the MTJ element 1, the switch 30 is turned on, and the reading circuit 2 is electrically connected to the MTJ element 1.

The low resistance state and high resistance state of the MTJ element 1, and writing of data by spin transfer are described below.

A parallel state (low resistance state) in which the magnetization directions of the reference layer 11A, 11B and the storage layer 13A, 13B are parallel to each other is described.

The majority of electrons which have passed through the reference layer 11A, 11B have spins parallel to the magnetization direction of the reference layer 11A, 11B. The spin angular momentum of the majority of electrons moves to the storage layer 13A, 13B, so that spin torque is applied to the storage layer 13A, 13B, and the magnetization direction of the storage layer 13A, 13B is arranged parallel to the magnetization direction of the reference layer 11A, 11B. The resistance value of the MTJ element 1 is lowest in the case of this parallel arrangement. This case is treated as, for example, "0" data.

Next, an antiparallel state (high resistance state) in which the magnetization directions of the reference layer 11A, 11B and the storage layer 13A, 13B are antiparallel is described.

The majority of electrons which have been reflected by the reference layer 11A, 11B have spins antiparallel to the magnetization direction of the reference layer 11A, 11B. The spin angular momentum of the majority of electrons moves to the storage layer 13A, 13B, so that spin torque is applied to the storage layer 13A, 13B, and the magnetization direction of the storage layer 13A, 13B is arranged antiparallel to the magnetization direction of the reference layer 11A, 11B. The resistance value of the MTJ element 1 is highest in the case of this antiparallel arrangement. This case is treated as, for example, "1" data.

Data is read by supplying the read current $I_{READ}$ to the MTJ element 1. A value defined by "(R1−R0)/R0" is called a magnetoresistance ratio (MR ratio), wherein R0 is a resistance value in the parallel state, and R1 is a resistance value in the antiparallel state. The magnetoresistance ratio varies depending on the material forming the MTJ element 1 and on process conditions, and can take a value of about several ten percent to several hundred percent.

A variation of the read current (potential of the bit line) attributed to the MR ratio is detected to read information stored in the MTJ element 1.

Figure 1B:
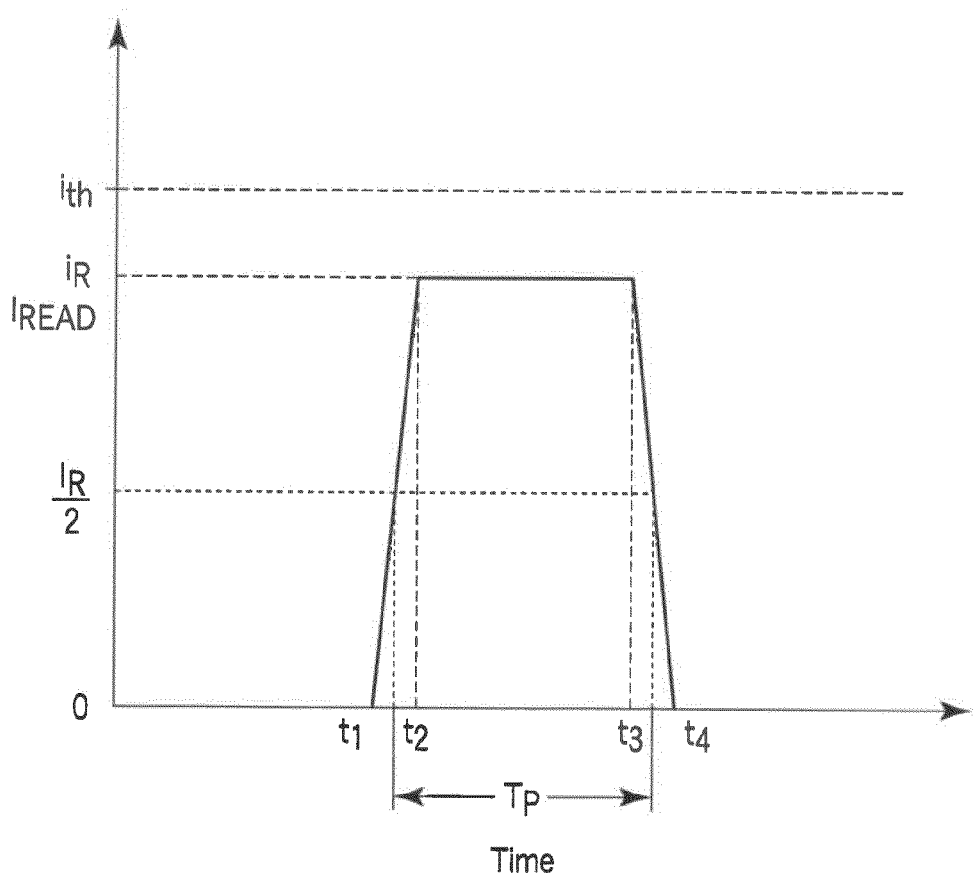
Figure 2:
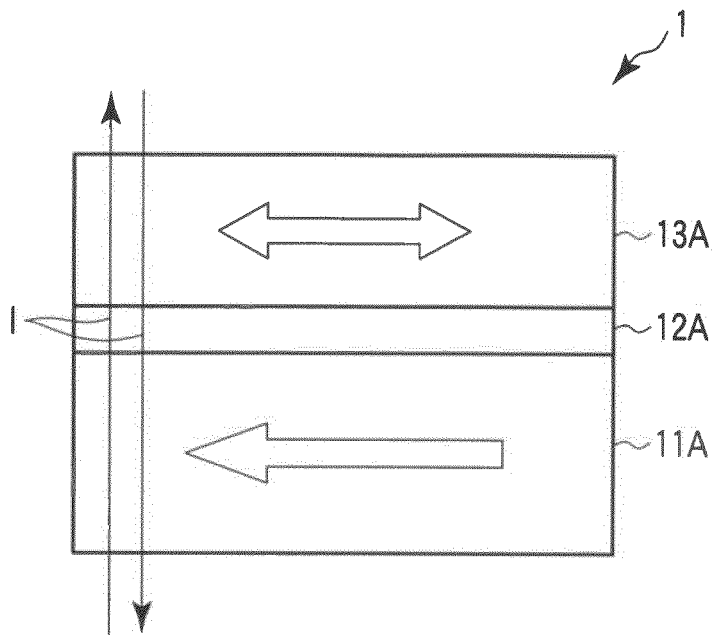
FIGS. 2A and 2B are diagrams showing one example of the structure of a magnetoresistive effect element.
Figure 2:
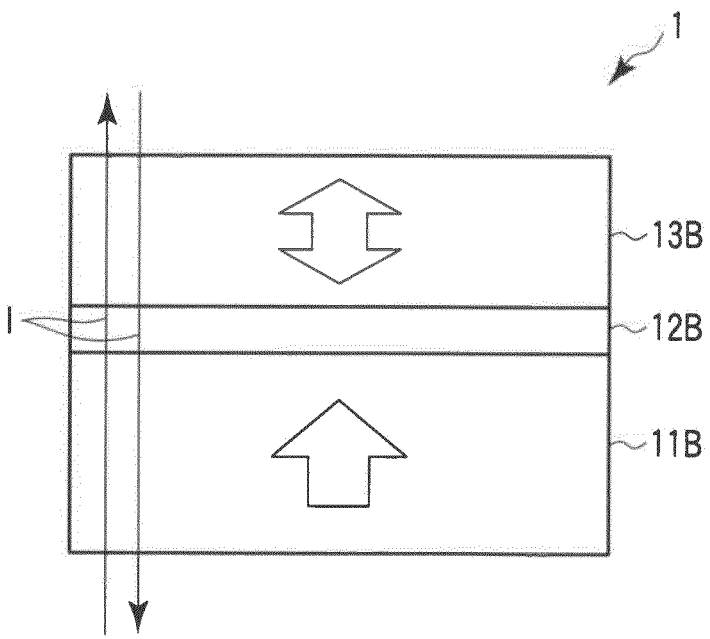

When reading the data stored in the MTJ element 1, the reading circuit 2 passes the pulse-shaped read current $I_{READ}$, for example, as shown in FIG. 1B through the MTJ element 1.

The magnetoresistive effect memory according to the present embodiment is characterized in that the pulse width $T_p$ of the read current $I_{READ}$ is shorter than a period extending from an initial state to a cooperative coherent precession movement of the magnetization of the storage layer.

Furthermore, the maximum value of a current value $i_r$ of the read current $I_{READ}$ is set at, for example, a value lower than an inversion threshold $i_{th}$ at which magnetization is inverted. The current value $i_r$ of the read current $I_{READ}$ is output at a constant level, for example, in a period extending from a time $t_2$ at which the rising of the pulse current ends to a time $t_3$ at which the falling of the pulse current starts.

In addition, in the present embodiment, the pulse width $T_p$ of the read current $I_{READ}$ is regulated by the full width at half maximum (FWHM) of a pulse. Specifically, the pulse width $T_p$ is a pulse width based on a value $i_r/2$ which is half a maximum current value $i_r$, and is a period between a time which is located between a time $t_1$ of the start of the rising of the pulse current and a time $t_2$ of the end of the rising and a time which is located between a time $t_3$ of the start of the falling and a time $t_4$ of the end of the falling.

As a result, in the magnetoresistive effect memory according to the present embodiment, occurrence of read disturb is reduced.

Thus, the pulse width $T_p$ of the read current $I_{READ}$ is set to be shorter than the time before the cooperative coherent precession movement of the magnetization of the storage layer so that the read disturb is prevented. This is based on a spin transfer magnetization inversion model described below.

Figure 3:
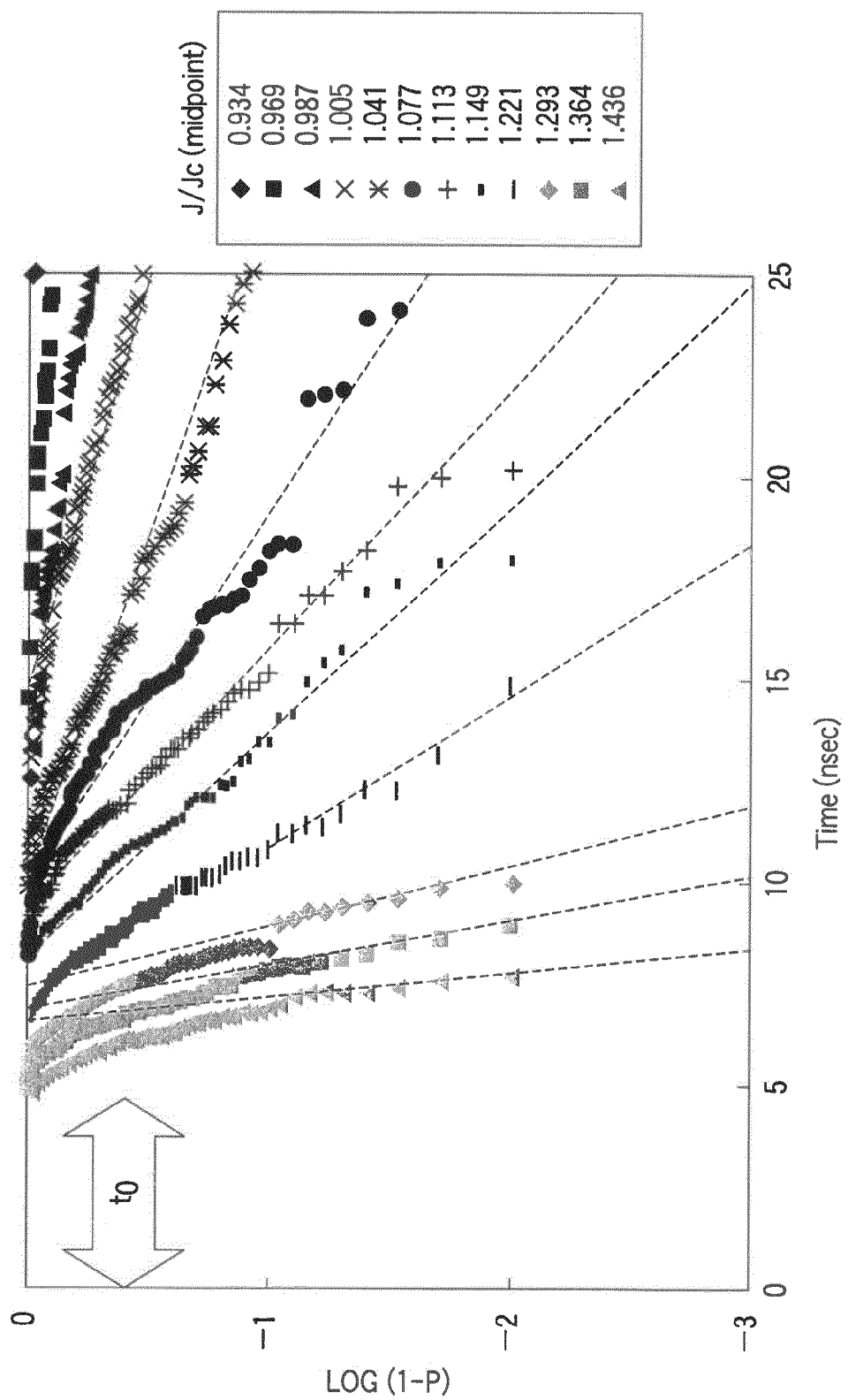
FIGS. 3, 4A, 4B, 5A, 5B and 6 are diagrams illustrating a spin transfer magnetization inversion model described in the present embodiment.

FIG. 3 shows the dependence of magnetization inversion probability on time, in the spin transfer magnetization inversion model described in the present embodiment. The horizontal axis in FIG. 3 indicates time (unit: nsec (nanosecond)). The vertical axis in FIG. 3 corresponds to the magnetization inversion probability. However, when the magnetization inversion probability is indicated by "P", the vertical axis in FIG. 3 indicates Log (1−P). "1−P" indicates the probability that magnetization is not inverted (data is not written). The magnetization inversion probability is the probability of the inversion of the magnetization of the storage layer in the case where a given current is passed through a certain MTJ element.

Characteristic curves shown in FIG. 3 indicate results obtained by a micromagnetic simulation using a Landau-Liftshitz-Gilbert (LLG) equation. Parameters using this simulation are as below.

The MTJ element used in the simulation is a perpendicular magnetization type MTJ element. The film thickness of the MTJ element is set at 2.2 nm, and the diameter of the MTJ element is set at 30 nm. The magnetization of the storage layer is perpendicular to the film surface, and the magnetic anisotropy energy Ku of the storage layer is 3.5 Merg/cc, and the saturation magnetization Ms of the storage layer is 500 emu/cc. An energy barrier $\Delta E_a$ is 86 $k_B T$ ($k_B$: Boltzmann constant). "T" indicates absolute temperature. The energy barrier $\Delta E_a$ indicates the size of an energy barrier that has to be overcome in the process of the inversion of the MTJ element from the parallel state to the antiparallel state or from the antiparallel state to the parallel state. The temperature (absolute temperature) T is set at 300 K. Further, the range of the density of a current J running through the MTJ element is set at 2.8 to 4 MA/cm². Then, the simulation is run using current density ratios J/Jc (22 nsec, midpoint) ranging from 0.934 to 1.436. In addition, "J" indicates the density of the pulse current, and "Jc (22 nsec, midpoint)" indicates a current density whereby the magnetization inversion probability of the storage layer of the MTJ element is 0.5 when a write current having a pulse width of 22 nsec is used to write data into the MTJ element.

FIG. 3 also shows first-order approximation characteristic lines corresponding to the characteristic curves obtained from the simulation using the current density ratios ranging from 0.934 to 1.436.

Spin transfer magnetization inversion probability P(t) can be approximately represented as in (Expression 4) on the basis of the characteristic curves shown in FIG. 3.

$$P(t) = 1 - \exp\left\{-(t-t_0)f_0 \exp\left[-\frac{\Delta E_a}{k_B T}\left(1 - \frac{I}{I_{c0}}\right)^n\right]\right\} \quad \text{(Expression 4)}$$

"P(t)" indicates the probability that the magnetization of the storage layer is inverted by the passage of a current pulse having a width of t through the MTJ element. "$f_0$" is the frequency with which the MTJ element receives heat energy (phonon) in a unit of time. "$f_0$" is about $1 \times 10^9$ Hz. "I" indicates the value of the pulse current, and "$I_{c0}$" is the value of a magnetization inversion current at 0 K (absolute temperature) in the case where a pulse width is set within the time (extending to about 1 ns) in which one phonon is received. In (Expression 4), "n" is a constant of 1.5 to 2.

As shown in FIG. 3, the probability Log (1−P) indicates a negative value with respect to the change of time. As in the cases shown in Reference 2 and (Expression 2), the magnetization of the storage layer is not inverted immediately after the pulse current is provided to the MTJ element, and the inversion of the magnetization is started after a time $t_0$ has passed.

Furthermore, in the present embodiment, magnetizations making a precession movement within magnetic particles (crystal grains) that constitute the storage layer are out of phase in the storage layer of the MTJ element during the time from the start of the application of the pulse current to the start of magnetization inversion. After a coherent precession movement whereby the magnetizations are in phase is enabled, magnetization inversion is started by a thermally-activated process. Such a magnetization inversion model has been proven by FIG. 3 and the following experiment and simulation.

Figure 4A:
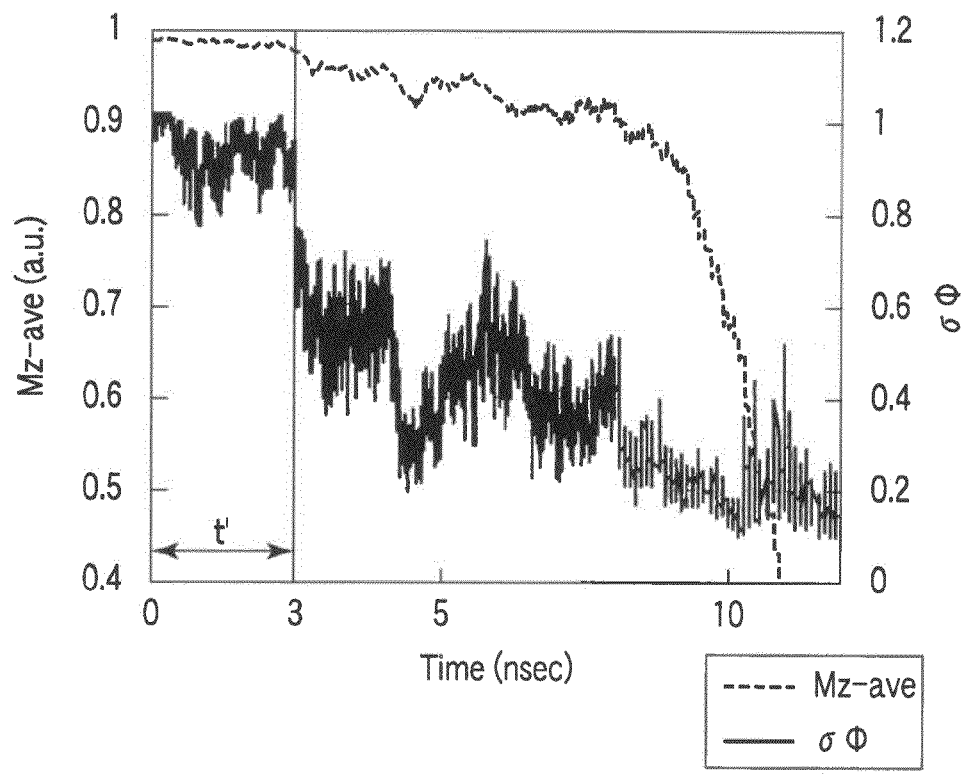

FIG. 4A is a graph showing an analysis of one simulation result based on the LLG equation for the spin transfer magnetization inversion of the perpendicular magnetization type MTJ element used in FIG. 3.

This simulation is run, for example, using 32 cells that show magnetizations in the storage layer (magnetic layer). The cells correspond to the magnetic particles contained in the magnetic layer. In FIG. 4A, the horizontal axis indicates time (unit: nsec). In FIG. 4A, a characteristic line indicated by a broken line corresponds to a left axis Mz-ave. The left axis Mz-ave in FIG. 4A indicates an average value Mz-ave (unit: a.u. (arbitrary unit)) of z components of the magnetization. In addition, on the Mz-ave of the z components of the magnetization, "1" indicates a condition in which the magnetization is directed upward with respect to the surface of the storage layer, and "−1" indicates a condition in which the magnetization is directed downward with respect to the surface of the storage layer.

In the simulation shown in FIG. 4A, the average value Mz-ave of the magnetization substantially indicates 1 in an initial state (0 nsec), and the magnetization is directed upward perpendicularly to the film surface of the MTJ element. Thus, verification is conducted for a process which extends from the start of the supply of a magnetization inversion current to the storage layer at 0 nsec to the inversion of the magnetization induced by spin transfer leading to an average value Mz-ave of about −1.

As shown in FIG. 4A, the value of the average value Mz-ave of the magnetization makes little change during the period from 0 nsec to 3 nsec. This period can be regarded as a period in which the magnetization (spin) of the storage layer is not inverted.

In FIG. 4A, a characteristic curve indicated by a full line corresponds to a right axis σΦ, and shows phase variations of the precession movement of 32 magnetizations in the storage layer.

Figure 4B:
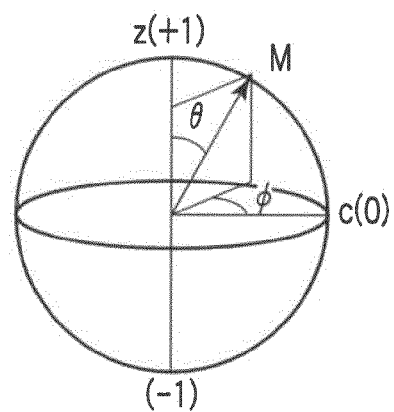

As shown in FIG. 4B, the direction of the magnetization can be represented by polar coordinates that use two arguments θ and an argument φ. The magnetization of a perpendicular magnetization film makes a precession movement on a rotation axis perpendicular to the film surface (z axis). The phase of the precession movement on an equatorial plane c is defined as the argument φ. Moreover, an angle between the inclination of a magnetization M and the z axis during the precession movement is defined as the argument θ.

The phase variations of the precession movement are obtained by checking the variations of the argument φ. However, the argument φ represented by polar coordinates is discontinuous with a period of +π or −π, or multivalued. Therefore, if the argument ϕ is simply used to calculate a phase dispersion (phase variations), an accurate calculation is not obtained in a part having discontinuous numerical values.

Thus, in the present embodiment, the phase of the precession movement is represented by a complex number, that is, "Φ=cos ϕ+isin ϕ" instead of the argument ϕ, whereby the phase dispersion σΦ is calculated, and phase variations are obtained. The complex number is thus used to represent the argument Φ, so that the problem arising from the discontinuity of the numerical values is solved, and the phase variations can be easily calculated. The phase dispersion σΦ is represented by (Expression 5) and (Expression 6):

$$\mu = \overline{\Phi}$$ (Expression 5)

$$\sigma\Phi = \sqrt{\frac{\sum(\Phi-\mu)(\Phi*-\mu*)}{n-1}}$$
$$= \sqrt{\frac{\sum\left(1-2(\cos\phi\overline{\cos\phi}+\sin\phi\overline{\sin\phi})+\overline{\cos\phi}^2+\overline{\cos\phi}^2\right)}{n-1}}$$ (Expression 6)

"n" in (Expression 5) and (Expression 6) indicates the number of magnetizations (number of cells) contained in the storage layer, and the number is 32 in this example. "Σ" in (Expression 5) and (Expression 6) indicates the calculation of the sum (total value) of all the magnetizations (32 magnetizations in this example) contained in the storage layer. "*" in (Expression 5) indicates a conjugate complex number. "‾" in (Expression 5) and (Expression 6) indicates the average value of the cells of all the magnetizations (32 magnetizations in this example) in the storage layer. Thus, "μ" in (Expression 5) indicates the average value of "Φ" of all the magnetizations in the storage layer.

Figure 5A:
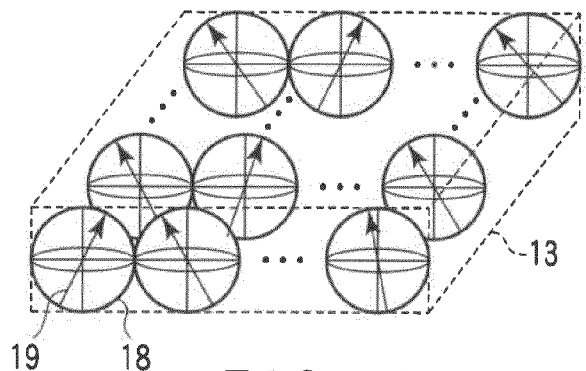
Figure 5B:
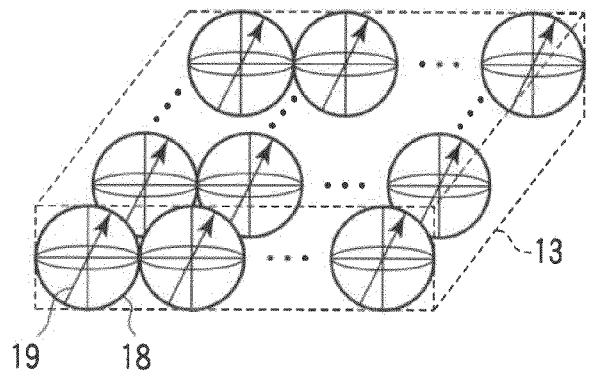

FIGS. 5A and 5B schematically shows cells of magnetizations arranged in the storage layer 13. Although a plurality of cells 18 are two-dimensionally arranged in the example shown in FIG. 5A, this example only serves for the ease of explanation, and it goes without saying that the present invention is not limited thereto.

For example, when all the phases of magnetizations 19 of the cells 18 in the storage layer 13 are random as shown in FIG. 5A, the phase dispersion σΦ indicates "1". On the other hand, when all the magnetizations 19 in the storage layer 13 are completely in phase as shown in FIG. 5B and the value of the argument Φ is the same, the phase dispersion σΦ indicates "0".

In the present embodiment, the cooperative precession movement of the magnetizations of the magnetic particles in the magnetic layer that are in phase is called a "coherent precession movement".

As shown in FIG. 4A, when the phase dispersion σΦ of the magnetizations in the storage layer decreases and the coherent precession movement of the magnetizations occurs, the movement of the magnetizations shifts to a thermally-activated process, and the inversion of the magnetizations is started. Then, the average value Mz-ave of the magnetizations starts dropping.

A period t' in FIG. 4A corresponds to the time extending before the coherent precession movement. However, the period t' extending from an initial state to the achievement of the coherent precession movement also varies when simulations are repeated under the same conditions. However, the phenomenon of starting magnetization inversion at the time when the magnetizations in the storage layer are in phase and the coherent precession movement is achieved is reproduced.

Consequently, the time t' in the spin transfer magnetization inversion can be regarded as the time extending from the condition in which the precession movement of the magnetizations 19 is not in phase in the storage layer 13 (see FIG. 5A) to the coherent condition in which the precession movement of the magnetizations 19 is in phase (see FIG. 5B). Therefore, it can be said that after the time before the coherent precession movement has passed, the thermally-activated process is reached, and the spin inversion of the storage layer of the MTJ element is started.

In addition, when the phase dispersion σΦ reaches about 0.5, the average value Mz-ave of the magnetizations drops to about 95% of an initial state (1). As a typical example, the time before a phase dispersion σΦ reaches 0.5 can be regarded as the time before the start of the coherent precession movement of the magnetizations.

The time before the coherent precession movement of the magnetizations depends on the intensity of a current I. If the intensity of the current I decreases, the time before the coherent precession movement of the magnetizations increases.

The time t' before the achievement of the coherent precession movement is present. Also, after the achievement of the coherent precession movement, a finite time extending from the start of the spin inversion to the completion of the spin inversion is present. Thus, taking the time t' into consideration, the time $t_0$ in (Expression 4) is included in the parameter of the spin transfer magnetization inversion model described in the present embodiment.

In addition, here, the condition for the completion of the spin transfer magnetization inversion is that the spin of the storage layer is not restored to the original state and is inverted to the end even if the current (pulse current) is turned off. This means that the direction of the magnetization is rotated to the equatorial plane c in FIG. 4B and a perpendicular component Mz of the magnetization reaches "0".

Figure 6:
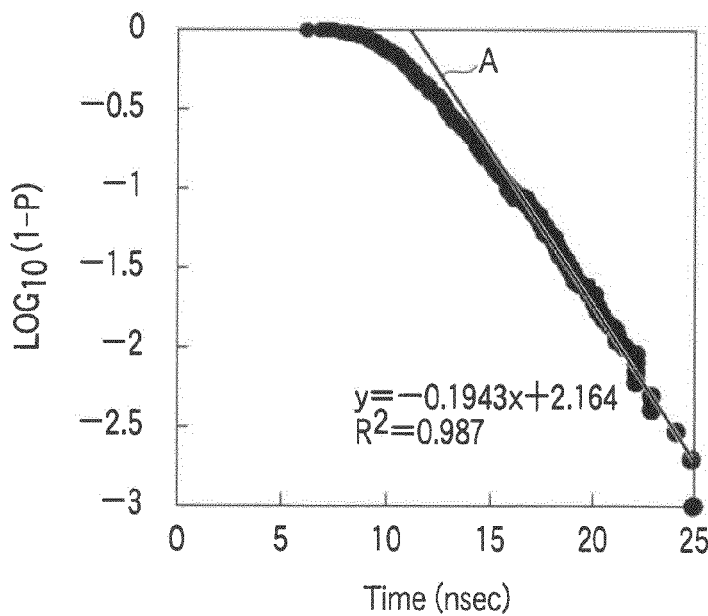

FIG. 6 shows the dependence of the magnetization inversion probability on time, wherein the dependence, on time, of the magnetization inversion probability of an MTJ element under the same conditions as the conditions in FIG. 4A is shown. It should be noted that the result shown in FIG. 6 is computed by a micromagnetic simulation using the LLG equation. The horizontal axis in FIG. 6 indicates time. The vertical axis in FIG. 6 indicates Log (1−P) as in FIG. 3.

FIG. 6 also shows that after the magnetizations in the storage layer show a coherent precession movement, the movement of the magnetizations shifts to a thermally-activated process so that the magnetizations in the storage layer are inverted. In addition, a characteristic line A shown in FIG. 6 is an approximate straight line that indicates a magnetization inversion model in the thermally-activated process, and is the straight line represented by (Expression 4).

Thus, the magnetizations present in the storage layer 13A, 13B of the MTJ element 1 cooperatively make the coherent precession movement, and then the direction of the magnetization in the storage layer 13A, 13B is inverted.

In the magnetoresistive effect memory according to the present embodiment, the pulse width $T_p$ of the read current $I_{READ}$ supplied to the MTJ element is set to be shorter than the time before the start of the cooperative coherent precession movement of the magnetization of the storage layer.

Thus, the time in which the read current is supplied to the MTJ element is shorter than the time required for the inversion of the magnetization, and the supply of the read current is stopped before the magnetizations in the storage layer make the coherent precession movement. This makes it possible to prevent the magnetization from being inverted by the read current, that is, to prevent data from being written by the read current.

Consequently, according to the magnetoresistive effect memory in the present embodiment, occurrence of read disturb can be reduced.

SPECIFIC EXAMPLE

A specific example of the magnetoresistive effect memory according to the present embodiment is described below with FIG. 7A and FIG. 14.

Although the approximate expression of (Expression 4) is not capable of showing, the time t' before the coherent precession movement shown in FIG. 4A is actually achieved varies depending on, for example, the operating condition of the MTJ element, the quality of the storage layer, and the degree of the phase variations of the magnetizations in the storage layer.

Therefore, it cannot always be said that the inversion probability is zero even if the pulse width $T_p$ of the read current $I_{READ}$ is set to be equal to or less than a certain time $t_0$.

That is, a time (hereinafter referred to as a magnetization inversion time or a switching time) $t_{sw}$ required for the inversion of the magnetization when a certain current I is supplied to the MTJ element fluctuates even in the case of the same MTJ element. This magnetization inversion time $t_{sw}$ indicates a value close to the time $t_0$ in (Expression 4) or the time t' before the coherent precession movement.

Figure 7A:
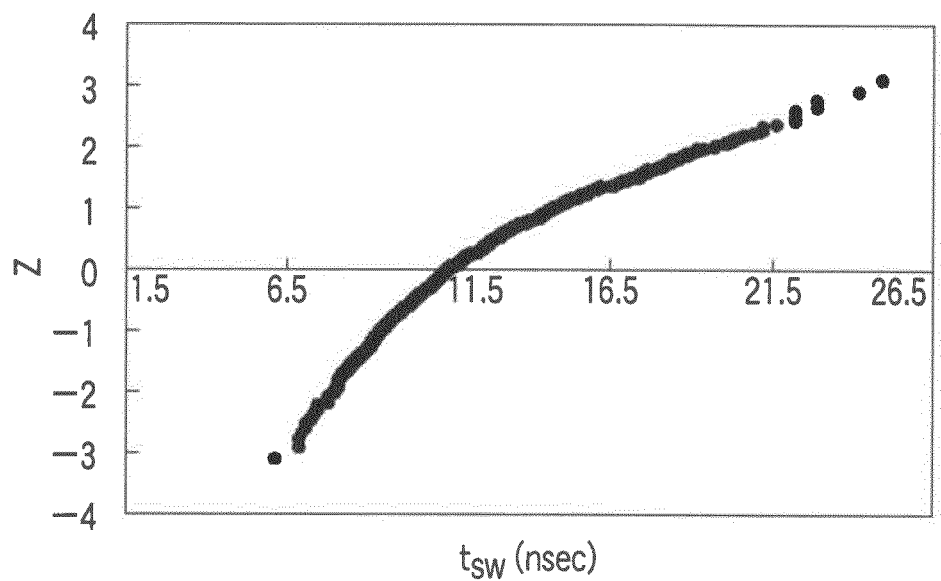
FIGS. 7A, 7B, 7C and 8 are diagrams illustrating a specific example of the magnetoresistive effect memory according to the present embodiment.
Figure 7B:
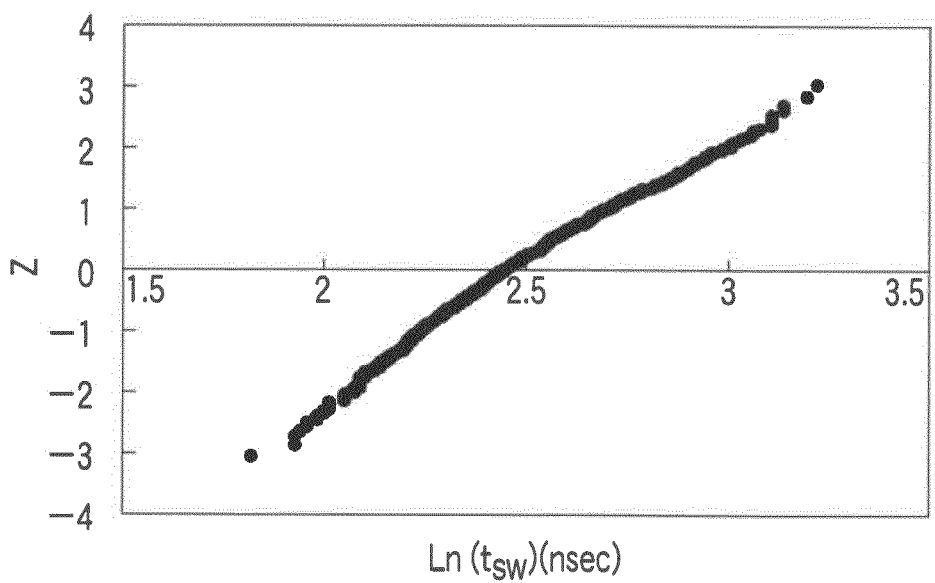

FIGS. 7A and 7B are graphs illustrating the distribution of the fluctuation of the magnetization inversion time $t_{sw}$ of the MTJ element. The vertical axes in FIGS. 7A and 7B indicate a Z value (standardized coefficient). The horizontal axes in FIGS. 7A and 7B indicate the magnetization inversion time $t_{sw}$. Further, the conditions of the MTJ element used to obtain the distribution in FIGS. 7A and 7B are the same as the conditions shown in FIG. 4A.

As shown in FIGS. 7A and 7B, the distribution of the fluctuation of the magnetization inversion time $t_{sw}$ is proximate to the logarithmic normal distribution shown in FIG. 7B rather than to the normal distribution shown in FIG. 7A. In other words, $Ln(t_{sw})$ which represents the distribution of the magnetization inversion time $t_{sw}$ using a natural logarithm (Ln) indicates a normal distribution.

The Z value in the distribution $Ln(t_{sw})$ of the magnetization inversion time $t_{sw}$ is represented by the following expression:

$$Z = E(I) \times Ln(t_{sw}) - F(I) \quad \text{(Expression 7)}$$

wherein "E(I)" and "F(I)" are constants dependent on the current I. A modification of (Expression 7) is (Expression 8).

$$t_{sw}(Z) = \exp\left(\frac{Z + F(I)}{E(I)}\right) \quad \text{(Expression 8)}$$

As shown in FIG. 7B, the distribution $Ln(t_{sw})$ of the magnetization inversion time $t_{sw}$ has a normal distribution. Therefore, as indicated by the distribution of probability density for the Z value in FIG. 7C, cumulative probability in the range from $-\infty$ (minus infinity) to a predetermined Z value can be obtained. In other words, the Z value can be determined by setting the cumulative probability at a certain value.

Here, the current I in (Expression 8) is defined as a read current. Therefore, the probability that read disturb occurs when a certain read current I is supplied to one MTJ element is defined as read disturb occurrence probability q. In this case, in the distribution $Ln(t_{sw})$ of the magnetization inversion time shown in FIG. 7B, the cumulative probability corresponds to the read disturb occurrence probability for one bit (one MTJ element).

Figure 7C:
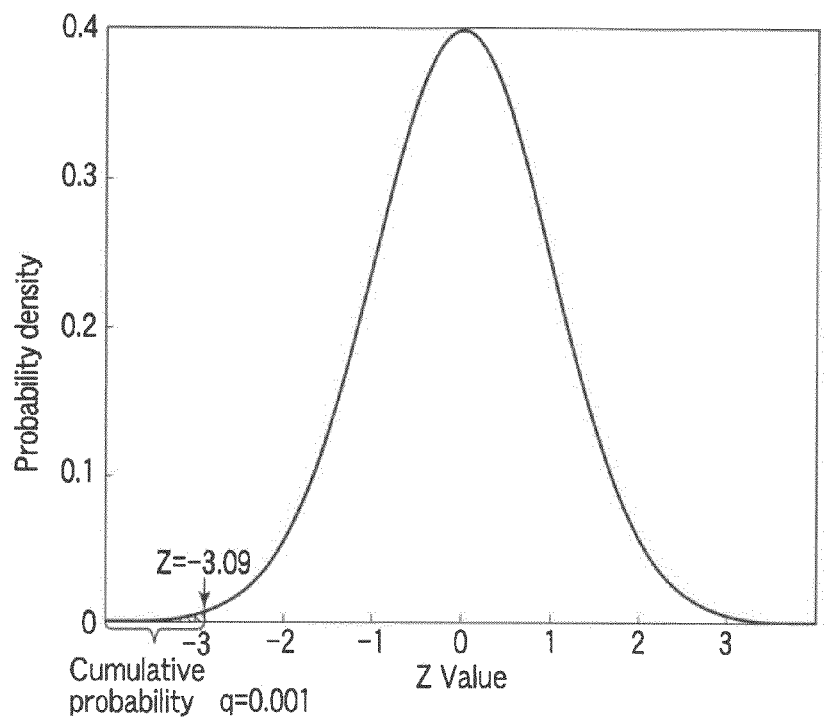

Therefore, for example, when the read disturb occurrence probability q is set at $0.001 (=1 \times 10^{-3})$, the Z value is $-3.09$, as shown in FIG. 7C. If this Z value ($-3.09$) is substituted for the coefficient Z in (Expression 8), the magnetization inversion time $t_{sw}$ ($q=1 \times 10^{-3}$) in which the read disturb occurrence probability q is 0.001 can be calculated. Therefore, the pulse width $T_p$ of the read current is set to be equal to or less than the obtained magnetization inversion time $t_{sw}$ ($q=1 \times 10^{-3}$). Thus, in the magnetoresistive effect memory that uses this read current, the read disturb occurrence probability can be equal to or less than 0.001.

When the read disturb occurrence probability q at a certain read current is set at $1 \times 10^{-9}$ or less, a Z value $=-6.00$ is obtained from FIG. 7C. Then, this Z value is substituted for the coefficient Z in (Expression 8) to calculate the magnetization inversion time $t_{sw}$ ($q=1 \times 10^{-9}$). Further, the pulse width $T_p$ of the read current is set to be equal to or less than the time $t_{sw}$ ($q=1 \times 10^{-9}$). Thus, in the magnetoresistive effect memory that uses this read current, the read disturb occurrence probability can be set at $1 \times 10^{-9}$ or less.

Similarly, when the read disturb occurrence probability q is set at $1 \times 10^{-12}$ or less, a Z value $=-7.03$ can be substituted for the coefficient Z in (Expression 8) to calculate the time $t_{sw}$ ($q=1 \times 10^{-12}$), and the pulse width $T_p$ of the read current can be set to be equal to or less than the time $t_{sw}$ ($q=1 \times 10^{-12}$). When the read disturb occurrence probability q is set at $4 \times 10^{-14}$ or less, a Z value $=-7.47$ can be substituted for the coefficient Z in (Expression 8) to calculate the time $t_{sw}$ ($q=4 \times 10^{-14}$), and the pulse width $T_p$ of the read current can be set to be equal to or less than the time $t_{sw}$ ($q=4 \times 10^{-14}$).

Further, the Z value is a value that indicates a standard deviation from the average value, and is not dependent on the conditions of, for example, components constituting the MTJ element.

Now, a more specific example that corresponds to the use of the magnetoresistive effect memory is presented to describe the allowable read disturb occurrence probability and the required pulse width $T_p$ (or $t_{sw}$) of the read current $I_{READ}$.

Further, in obtaining conditions required for the pulse width of the read current, a referential current (current density) is needed. As the referential current (predetermined current density), a "current density Jc (10 nsec, midpoint)" is used here.

Figure 8:
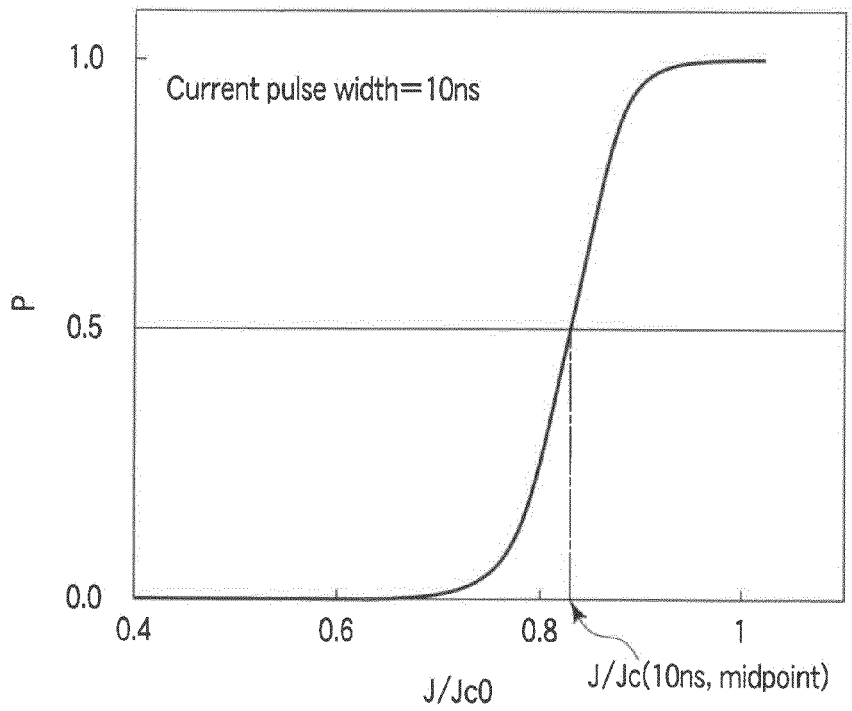

This current density Jc (10 nsec, midpoint) is described with FIG. 8. FIG. 8 shows the dependence of magnetization inversion probability P on a current density ratio $J/J_{C0}$. "J" indicates the density of the pulse current, and "$J_{C0}$" indicates the current density of an inversion threshold in the case where a pulse width is set within the time in which one phonon is received.

When a current having a constant pulse width is passed through the MTJ element to invert the magnetization of the MTJ element, the magnetization inversion probability P is uniquely determined in accordance with the density of the magnetization inversion current supplied to the MTJ element.

The magnetization inversion probability P(t) indicated by (Expression 2) is represented using the current density, as shown in the following expression (Expression 9):

$$P(t) = 1 - \exp\left\{-(t-t_0)f_0 \exp\left[-\frac{\Delta E_a}{k_B T}\left(1 - \frac{J}{J_{c0}}\right)^n\right]\right\} \quad \text{(Expression 9)}$$

As shown in FIG. 8 and (Expression 9), when a plurality of current densities are used for a certain MTJ element to calculate the magnetization inversion probability P(t), a current density that provides certain magnetization inversion probability can be obtained.

The current density whereby the magnetization inversion probability P(t) is 0.5 is at the midpoint of the vertical axis of the characteristic curve indicating the magnetization inversion probability P(t), and a more accurate value can be obtained with a relatively small number of experiments by calculating the magnetization inversion probability using other current densities.

Thus, hereinafter, in this specific example, the referential current (current density) is a current at which the magnetization inversion probability is 0.5.

A referential pulse width is as shown below.

For example, if the pulse width of a current reaches about 1 nsec, the magnetization inversion of the magnetic layer will be magnetization inversion in a region called a dynamic region or precession region. The magnetization inversion in this region shows a magnetization inversion process that is different from the magnetization inversion process in the case where a current having a pulse width of 10 nsec or more is used, and the magnetization inversion process is an adiabatic process. Therefore, when a current having a pulse width of about 1 nsec is used as the read current, the situation is different from the case where read disturb is subject to thermal disturbance. Moreover, a pulse width of about 10 nsec is used in a typical example of a write current used for the magnetoresistive effect memory. Thus, the use of the write current having a pulse width of 10 nsec as a reference is practical and allows easy verification.

Therefore, in the following specific examples, the density Jc (10 nsec, midpoint) of a current having a pulse width of about 10 nsec whereby the magnetization inversion probability P is 0.5 is used to obtain a condition required for the pulse width of the read current. That is, the current density Jc (10 nsec, midpoint) serves as the parameter of "I" of (Expression 8).

The current density, Jc (10 nsec, midpoint) is used to describe the condition required in accordance with the use of the magnetoresistive effect memory.

(a) Specific Example 1

An example of the use of the magnetoresistive effect memory according to the present embodiment for an electricity usage meter is described below with FIG. 9.

The magnetoresistive effect memory (e.g., an MRAM) used for an electricity usage meter has a storage capacity of, for example, about 512 kbit.

The magnetoresistive effect memory in Specific Example 1 stores a power use record as data, and the data is written rapidly and frequently. On the other hand, the frequency of data reading is extremely low, so that, for example, a power use record is read from the magnetoresistive effect memory once a month. That is, data is read twelve times a year.

When the magnetoresistive effect memory is thus used for an electricity usage meter, the meter can be used without any read disturb for twenty years if the read disturb occurrence probability for one bit is 0.001 or less.

Furthermore, in order to set the read disturb occurrence probability q at 0.001 or less, −3.09 is used as the Z value in FIG. 7C as described above.

Figure 9:
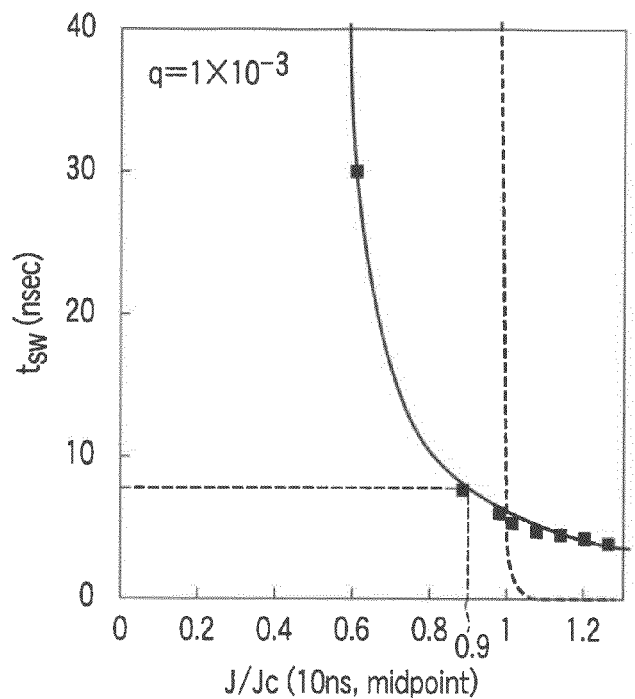
FIGS. 9, 10, 11 and 12 are graphs showing a magnetization inversion time with respect to current density.

FIG. 9 shows, by a full line, the magnetization inversion time $t_{sw}$ (q=1×10$^{-3}$) obtained with respect to the current density ratio J/J$_C$ (10 nsec, midpoint) in the case where the read disturb occurrence probability q is 0.001. The vertical axis in FIG. 9 indicates the magnetization inversion time $t_{sw}$. The horizontal axis in FIG. 9 indicates the ratio between the density J of the current supplied to the MTJ element and the current density J$_C$ (10 nsec, midpoint). In addition, a characteristic line indicated by a broken line in FIG. 9 is based on the magnetization inversion model indicated by (Expression 1) in the case where the same current density ratio J/J$_C$ (10 nsec, midpoint) is used.

When the magnetization inversion time $t_{sw}$ equal to or less than a value indicated by the full line in FIG. 9 is used for the pulse width $T_p$ of the read current $I_{READ}$ to read from the memory, the read disturb occurrence probability is 0.001 or less.

This ensures the operation and practical application of the magnetoresistive effect memory used as an electricity usage meter. Moreover, it is apparent from the difference in the shape of the obtained characteristic lines that the magnetization inversion model described in the embodiment of the present invention (see (Expression 4)) is different from the magnetization inversion model shown in (Expression 1).

Taking this into consideration, the condition permitted as the pulse width $T_p$ (=$t_{sw}$) (unit: nsec) of the read current is expressed as a function of the density $J_{read}$ of the read current, as shown in (Expression 10).

$$T_p \leq \frac{3.00}{\frac{J_{read}}{J_C(10 \text{ nsec, midpoint})} - 0.51} \quad \text{(Expression 10)}$$

Since about several percent of the variations of the bits of the read current resulting from circuit variations are anticipated, the current density ratio J/J$_C$ (10 nsec, midpoint) has to be set to 0.9 times or less, that is, the density of the read current has to be set to 0.9 times or less than the current density J$_C$ (10 nsec, midpoint). As shown in FIG. 9, it is obvious that the pulse width of the read current is 8 nsec or less when the current density ratio J/J$_C$ (10 nsec, midpoint) is 0.9.

Although the magnetoresistive effect memory according to the present embodiment is used for an electricity usage meter in the case described in this specific example, the magnetoresistive effect memory according to the present embodiment is not limited thereto and may be used for a gas or water usage meter.

(b) Specific Example 2

Specific Example 2 of the magnetoresistive effect memory according to the present embodiment is described below with FIG. 10. In the case described here, the magnetoresistive effect memory is used as a work memory of a computer.

Due to a high read frequency, the work memory of the computer is subject to the read disturb.

Although a 1-Gbit magnetoresistive effect memory (e.g., an MRAM) is described below by way of example, it should be understood that there is no dependence on the capacity of the memory. In the case described here by way of example, the magnetoresistive effect memory is used as the work memory under the following conditions: one write cycle is set at 50 nsec; one read cycle is set at 50 nsec; and the memory is used for ten years. Then, when read disturb occurs, an error (erroneous write) caused by the read disturb is corrected by, for example, error checking and correcting (ECC). With regard to write/read data, one unit consists of, for example, 32 bits, and 6 bits are further added for error correction by a hamming code, so that one block consists of 38-bit data. For the data of one block, an error in the write/read data is corrected. Further, read data is subjected to error detection and correction by the ECC every time, and then again written into the memory.

Specific Example 2 requires that the probability $p_{2+}$ of the simultaneous occurrence of two or more bits of errors (erroneous writes) resulting from read disturb in one block be held down to less than $1.59 \times 10^{-16}$ in one read cycle. In this case, the number of errors resulting from read disturb when the magnetoresistive effect memory is used as the work memory for ten years is less than 0.5.

The relational expression of the read disturb occurrence probability q for one bit (one MTJ element) and the probability $p_{2+}$ of the simultaneous occurrence of two or more bits of errors in one block is represented by (Expression 11) to (Expression 13) as below.

First, the probability $p_0$ of no occurrence of error resulting from read disturb in one read cycle can be represented by (Expression 11):

$$p_0 = \frac{1}{2j}\sum_{r=0}^{j} {}_jC_r(1-q)^r \quad \text{(Expression 11)}$$

wherein "j" indicates the number of bits in one block, and is 38 in Specific Example 2.

The probability $p_1$ of the occurrence of one bit of error resulting from read disturb in one block in one read cycle can be represented by (Expression 12):

$$p_1 = \frac{1}{2j}\sum_{r=0}^{j} {}_jC_r rq(1-q)^{r-1} \quad \text{(Expression 12)}$$

The probability $p_{2+}$ of the simultaneous occurrence of two or more bits of errors resulting from read disturb in one block is represented by (Expression 13) using (Expression 11) and (Expression 12):

$$p_{2+} = 1 - p_0 - p_1 \quad \text{(Expression 13)}$$

As described above, Specific Example 2 requires that the probability $p_{2+}$ of the simultaneous occurrence of two or more bits of errors resulting from read disturb be less than $1.59 \times 10^{-16}$.

In accordance with (Expression 13), the read disturb occurrence probability q for one bit is set at $1 \times 10^{-9}$ or less, so that the probability $p_{2+}$ of the simultaneous occurrence of two or more bits of errors resulting from read disturb is less than $1.59 \times 10^{-16}$.

Thus, in order to set the number of times of the occurrence of errors resulting from read disturb at 0.5 or less when the magnetoresistive effect memory is used as the work memory of the computer for ten years, the read disturb occurrence probability q for one bit can be set at $1 \times 10^{-9}$ or less.

Figure 10:
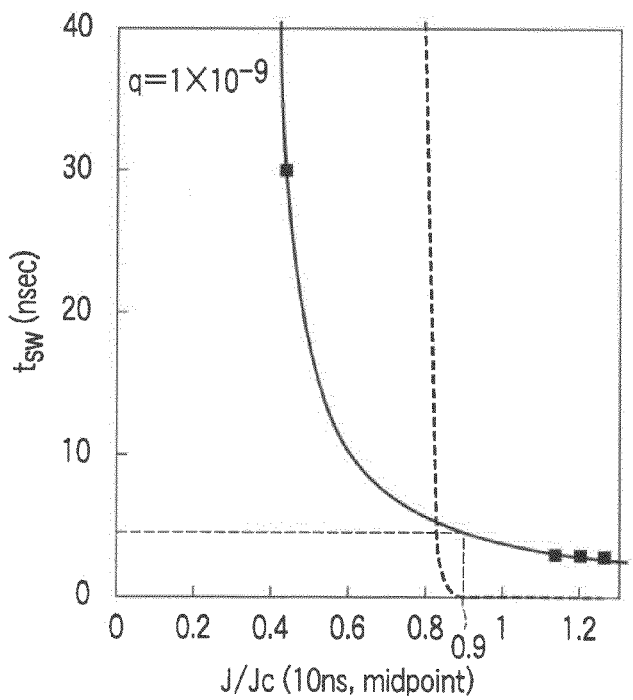

FIG. 10 shows, by a full line, the magnetization inversion time $t_{sw}$ ($q=1 \times 10^{-9}$) obtained with respect to the current density ratio $J/J_C$ (10 nsec, midpoint) in the case where the read disturb occurrence probability q is $1 \times 10^{-9}$. A characteristic line indicated by a broken line in FIG. 10 is based on the magnetization inversion model indicated by (Expression 1). Further, the Z value at which the read disturb occurrence probability q is $1 \times 10^{-9}$ is −6.00 as described above.

When the magnetization inversion time $t_{sw}$ equal to or less than a value indicated by the full line is used for the pulse width $T_p$ of the read current $I_{READ}$ to read from the memory, the read disturb occurrence probability q is $1 \times 10^{-9}$ or less.

This ensures the operation and practical application of the magnetoresistive effect memory used as the work memory. Moreover, as shown in FIG. 10, it is apparent from the difference in the tendencies shown in the obtained characteristic lines that the magnetization inversion model described in the embodiment of the present invention (Expression 4) is different from the magnetization inversion model shown in (Expression 1).

Furthermore, as in the example shown in FIG. 9, the condition permitted as the pulse width $T_p$ of the read current is expressed as a function of the density $J_{read}$ of the read current, as shown in (Expression 14).

$$T_p \leq \frac{2.53}{\frac{J_{read}}{J_C(10 \text{ nsec, midpoint})} - 0.35} \quad \text{(Expression 14)}$$

(c) Specific Example 3

Specific Example 3 of the magnetoresistive effect memory according to the present embodiment is described below with FIG. 11.

In the case described here, the magnetoresistive effect memory is used as a work memory of a computer, as in Specific Example 2. Specific Example 3 assumes that the frequency of failure occurrence with which about 0.5 errors resulting from read disturb occur in ten-year use is set at 1 ppm ($1 \times 10^{-6}$) or less. In this case, the read disturb occurrence probability q for one bit has only to be $1 \times 10^{-12}$ or less.

Figure 11:
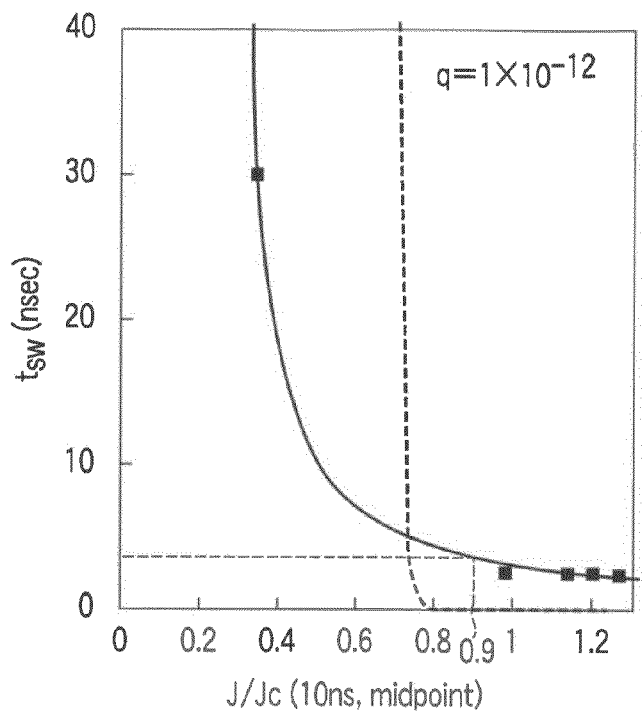

FIG. 11 shows, by a full line, the magnetization inversion time $t_{sw}$ ($q=1 \times 10^{-12}$) obtained with respect to the current density ratio $J/J_C$ (10 nsec, midpoint) in the case where the read disturb occurrence probability q is $1 \times 10^{-12}$. A characteristic line indicated by a broken line in FIG. 11 is based on the magnetization inversion model indicated by (Expression 1). Further, the Z value at which the read disturb occurrence probability q is $1 \times 10^{-12}$ is −7.03 as described above.

As in the cases described in FIG. 9 and FIG. 10, when the magnetization inversion time $t_{sw}$ equal to or less than a value indicated by the full line is used for the pulse width $T_p$ of the read current $I_{READ}$ to read from the memory, the read disturb occurrence probability q is $1 \times 10^{-12}$ or less.

Thus, the frequency of failure occurrence with which about 0.5 errors resulting from read disturb occur in ten-year use is set at 1 ppm or less. This ensures the operation and practical application of the magnetoresistive effect memory used as the work memory. Moreover, as shown in FIG. 11, it is apparent from the difference in the tendencies shown by the obtained characteristic lines that the magnetization inversion model described in the embodiment of the present invention (see (Expression 4)) is different from the magnetization inversion model shown in (Expression 1).

Furthermore, as in the examples shown in FIG. 9 and FIG. 10, the condition permitted as the pulse width $T_p$ of the read current can be expressed by (Expression 15) as a function of the density $J_{read}$ of the read current in Specific Example 3.

$$T_p \le \frac{2.39}{\frac{J_{read}}{J_C(10 \text{ nsec, midpoint})} - 0.27} \quad \text{(Expression 15)}$$

(d) Specific Example 4

Specific Example 4 of the magnetoresistive effect memory according to the present embodiment is described below with FIG. 12. In the case described in Specific Example 4, the magnetoresistive effect memory is used as a work memory of a computer as in Specific Example 2 and Specific Example 3.

Specific Example 4 assumes that, instead of performing the ECC for every reading of data to verify and correct the data, data is corrected about one time in 1000 read operations, and the corrected data is rewritten in the memory.

Then, the frequency of failure occurrence with which about 0.5 errors resulting from read disturb occur in ten-year use is set at 1 ppm or less. In this case, the read disturb occurrence probability q for one bit has only to be $4 \times 10^{-14}$ or less.

Figure 12:
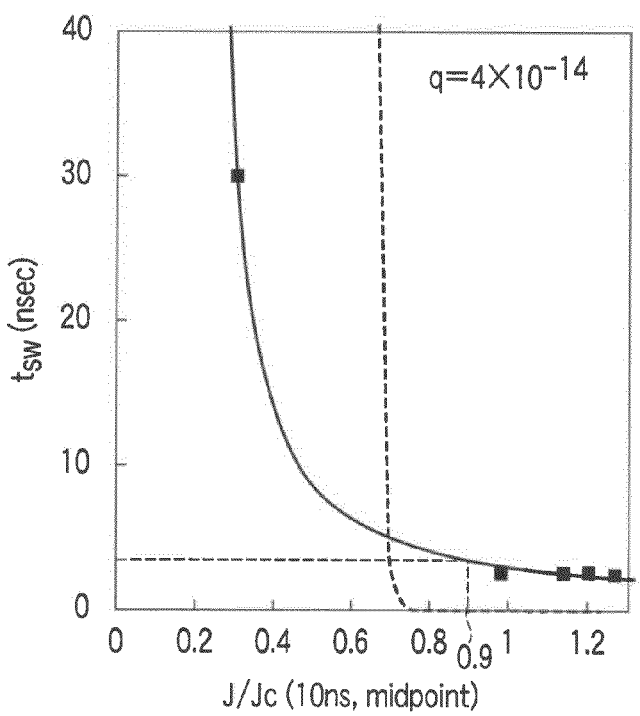

FIG. 12 shows, by a full line, the magnetization inversion time $t_{sw}$ ($q=4 \times 10^{-14}$) obtained with respect to the current density ratio $J/J_C$ (10 nsec, midpoint) in the case where the read disturb occurrence probability q is $4 \times 10^{-14}$. A characteristic line indicated by a broken line in FIG. 12 is based on the magnetization inversion model indicated by (Expression 1). Further, the Z value at which the read disturb occurrence probability q is $4 \times 10^{-14}$ is −7.47 as described above.

As in other examples, when the magnetization inversion time $t_{sw}$ equal to or less than a value indicated by the full line is used for the pulse width $T_p$ of the read current $I_{READ}$ to read from the memory, the read disturb occurrence probability q is $4 \times 10^{-14}$ or less.

Thus, when data is corrected one time in 1000 read operations in ten-year use, the frequency of failure occurrence with which about 0.5 errors resulting from read disturb occur is 1 ppm or less. Further, in the example shown in FIG. 12 as well, it is apparent that the magnetization inversion model described in the embodiment of the present invention (see (Expression 4)) is different from the magnetization inversion model shown in (Expression 1).

In Specific Example 4, as in other examples, the condition permitted as the pulse width $T_p$ of the read current can be expressed by (Expression 16) as a function of the density $J_{read}$ of the read current.

$$T_p \le \frac{2.29}{\frac{J_{read}}{J_C(10 \text{ nsec, midpoint})} - 0.23} \quad \text{(Expression 16)}$$

(e) Summary (Regarding the Pulse Width of the Read Current)

As described in Specific Example 1 to Specific Example 4, the value permitted as the read disturb occurrence probability q for one bit (one MTJ element) in a memory chip is uniquely obtained in accordance with how a memory chip is used, for example, in accordance with the guaranteed value of the failure occurrence frequency, operation conditions for the number of times of reading, and the application of an error correction technique such as the ECC.

In order to set the read disturb occurrence probability q equal to or less than a permissible value corresponding to the use, the pulse width $T_p$ of the read current has to be equal to or less than a given value when other conditions are constant.

The following expression represents standardization of the pulse width $T_p$ of the read current $I_{READ}$ based on the condition permitted as the pulse width $T_p$ of the read current $I_{READ}$ (magnetization inversion time $t_{sw}$) as in (Expression 10), (Expression 14), (Expression 15) and (Expression 16)

$$T_p \le \frac{A}{\frac{J_{read}}{J_C(10 \text{ nsec, midpoint})} - B} \quad \text{(Expression 17)}$$

The coefficient "A" and the coefficient "B" in (Expression 17) are parameters dependent on the read disturb occurrence probability q for one bit, that is, one MTJ element. The coefficient "A" and the coefficient "B" are parameters dependent on the material properties and size of the storage layer. In particular, the coefficient "A" is strongly dependent on the damping constant and saturation magnetization of the storage layer. The coefficient "A" and the coefficient "B" are less dependent on other material properties and size of the storage layer.

Figure 13:
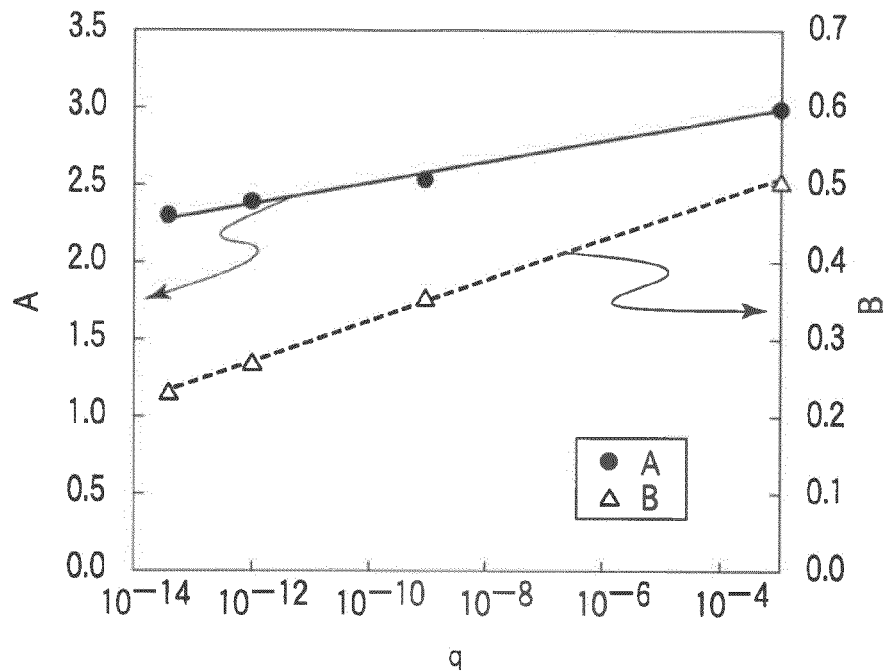
FIG. 13 is a graph showing the dependence of parameters included in the magnetization inversion time on read disturb.

FIG. 13 shows the dependence of the parameters "A" and "B" included in (Expression 16) on the read disturb occurrence probability q in accordance with a simulation and an experiment. In addition, the damping constant $\alpha_{damp}$ of the storage layer used in the simulation and the experiment is set at 0.01, and the saturation magnetization Ms of the storage layer is set at 500 emu/cc.

In FIG. 13, the horizontal axis indicates the read disturb occurrence probability q. In FIG. 13, the left vertical axis indicates the value of the parameter A, and the right vertical axis indicates the value of the parameter B. The full line indicates the characteristic line of the parameter A, and the broken line indicates the characteristic line of the parameter B. The characteristic lines of the parameters A and B shown in FIG. 13 can be represented as in, for example, (Expression 18) and (Expression 19). In addition, "Ln" indicates a natural logarithm in (Expression 18) and (Expression 19).

$$A = 0.0296 \text{ Ln}(q) + 3.188 \quad \text{(Expression 18)}$$

$$B = 0.0116 \text{ Ln}(q) + 0.591 \quad \text{(Expression 19)}$$

If (Expression 17) to (Expression 19) are used to more finely set the pulse width of the read current, a magnetoresistive effect memory with reduced read disturb can be provided.

(Regarding the Dependence of the Damping Constant on the Magnetization Inversion Time)

Here, the dependence of the damping constant of the storage layer on the magnetization inversion time (the pulse width of the read current) of the MTJ element is described.

The magnetization inversion time of the MTJ element is longer when the saturation magnetization of the storage layer is greater, and is longer when the damping constant of the storage layer is lower.

Figure 14:
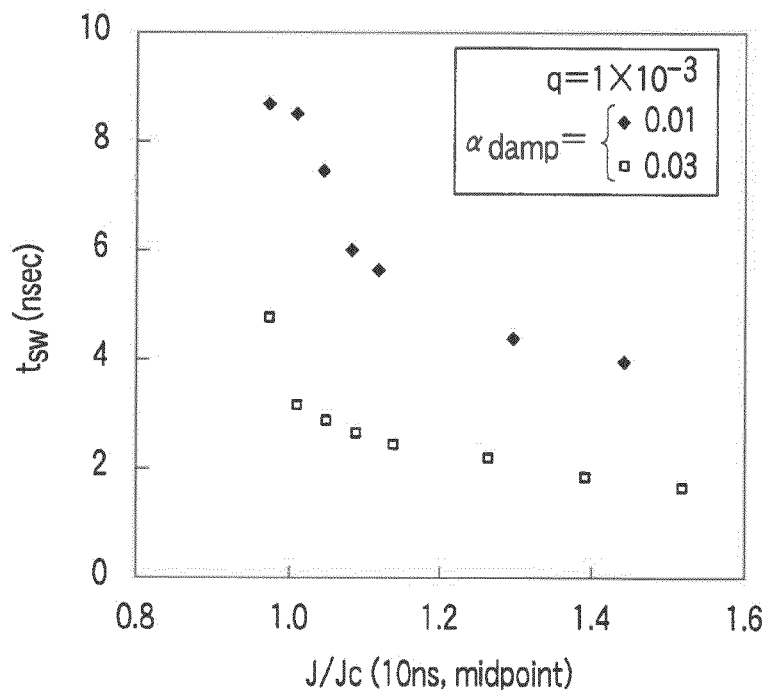
FIG. 14 is a graph showing the dependence of a damping constant of a magnetic layer on the magnetization inversion time.

FIG. 14 shows the change of the magnetization inversion time $t_{sw}$ with respect to the current density ratio $J/J_C$ (10 nsec, midpoint) in the case where the damping constant of the storage layer is set at $\alpha_{damp}=0.01$ and $\alpha_{damp}=0.03$. In FIG. 14, the read disturb occurrence probability q is set at $1 \times 10^{-3}$. The horizontal axis in FIG. 14 indicates the current density ratio $J/J_C$ (10 nsec, midpoint). The vertical axis in FIG. 14 indicates the magnetization inversion time $t_{sw}$ (=pulse width $T_p$).

As shown in FIG. 14, the magnetization inversion speed $t_{sw}$ when the damping constant $\alpha_{damp}$ of the storage layer is 0.01 is about 2.3 times as high as the magnetization inversion speed when the damping constant $\alpha_{damp}$ is 0.03.

The parameter A can be represented by (Expression 20) on the basis of the dependence of the storage layer on the magnetization inversion time obtained from FIG. 14.

$$A = \left(1.7 \times 10^{-5} \times \frac{Ms}{\alpha_{damp}} + 0.15\right) \times (0.0296 \operatorname{Ln}(q) + 3.188) \quad \text{(Expression 20)}$$

Constants shown in (Expression 20) are as follows: "$\alpha_{damp}$" indicates the damping constant of the storage layer, and is, for example, 0.05 to 0.01. "Ms" indicates the saturation magnetization of the storage layer, and the unit of "Ms" is emu/cc. The saturation magnetization Ms of the storage layer is, for example, 500 to 1000 emu/cc. "Ln" indicates a natural logarithm. "q" indicates the read disturb occurrence probability for one bit (one MTJ element).

Thus, the constant A shown in (Expression 20) can be indicated by the damping constant and saturation magnetization of the storage layer. Consequently, the pulse width $T_p$ of the read current shown in (Expression 20) is a value dependent on the damping constant and saturation magnetization of the storage layer.

As described above, when the damping constant and saturation magnetization of the storage layers constituting the MTJ element are taken into consideration, a more desirable pulse width $T_p$ of the read current can be set.

As described in the specific examples of the present embodiment, by using (Expression 17) to (Expression 19) to set the pulse width $T_p$ of the read current, a pulse width $T_p$ suitable for the use of the magnetoresistive effect memory (e.g., an MRAM) can be set.

Consequently, read disturb in the magnetoresistive effect memory can be reduced.

[Application]

An application of the embodiment of the present invention is described next.

The magnetoresistive effect memory according the embodiment of the present invention is used for a spin transfer type magnetoresistive random access memory (MRAM). The configuration of the MRAM is described below with FIG. 15 to FIG. 25.

(1) Overall Configuration

FIG. 15 is a diagram showing the circuit configuration of the vicinity of a memory cell array in the MRAM.

A plurality of memory cells MC are arrayed in a memory cell array 20.

Figure 16:
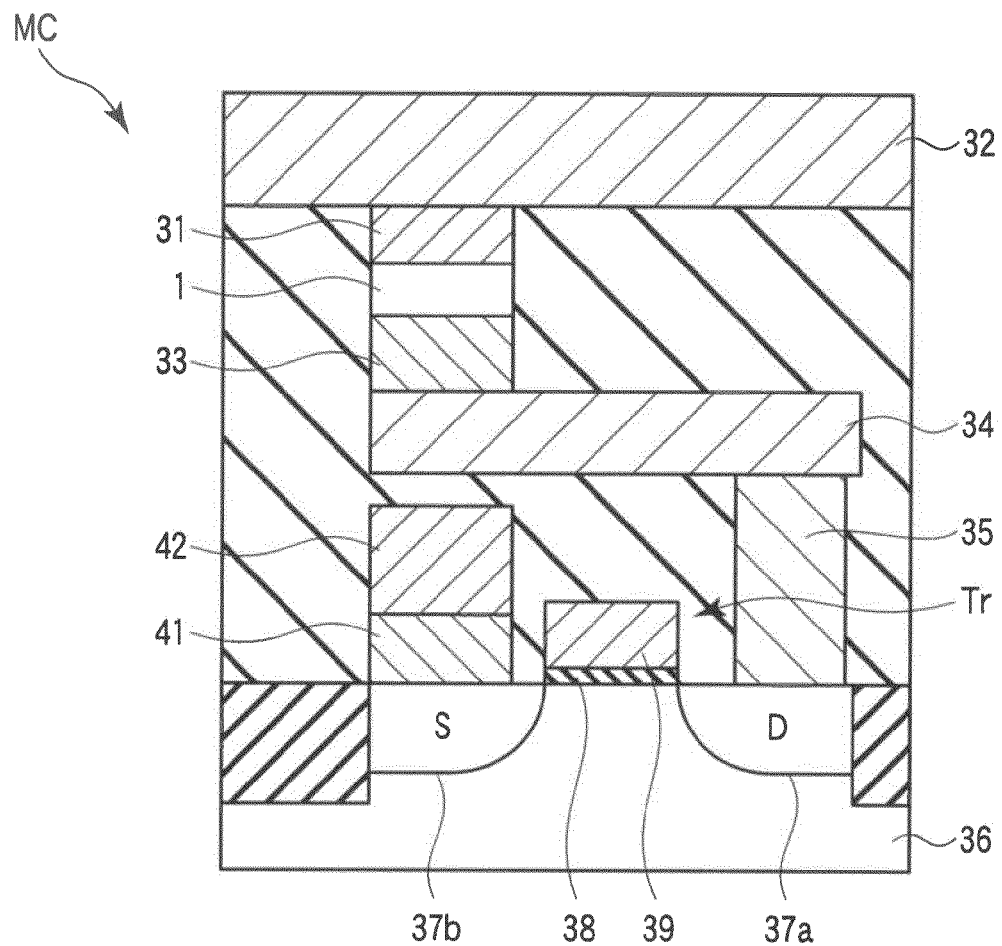
FIG. 16 is a diagram showing one example of the structure of a memory cell.

FIG. 16 is a diagram showing one example of the structure of a memory cell MC provided in the memory cell array 20. The upper end of an MTJ element 1 is connected to an upper bit line 32 via an upper electrode 31. Further, the lower end of an MTJ element 1 is connected to a source/drain diffusion layer 37a of a select transistor ST via a lower electrode 33, a leader interconnect 34 and a plug 35. A source/drain diffusion layer 37b of the select transistor ST is connected to a lower bit line 42 via a plug 41.

A gate electrode (word line) 39 is formed on a semiconductor substrate (channel region) 36 between the source/drain diffusion layer 37a and the source/drain diffusion layer 37b via a gate insulating film 38.

In addition, at least one of the lower electrode 33 and the leader interconnect 34 may be omitted. For example, when the lower electrode 33 is omitted, the MTJ element 1 is formed on the leader interconnect 34. When the leader interconnect 34 is omitted, the lower electrode 33 is formed on the plug 35. When the lower electrode 33 and the leader interconnect 34 are omitted, the magnetoresistive effect element 1 is formed on the plug 35.

A word line WL extends in a row direction, and is connected to the gate of a select transistor Tr forming the memory cell MC.

One end of the word line WL is connected to a row control circuit 4. The row control circuit 4 selects a word line WL.

Bit lines BL, bBL extend in a column direction. One end of the MTJ element 1 is connected to the bit line BL, and the bit line bBL is connected to one end of the current path of the select transistor Tr. The two bit lines BL, bBL constitute a bit line pair.

Column control circuits 3A, 3B are connected to the bit lines BL, bBL on one end and the other. Writing circuits 5A, 5B are connected to both ends of the bit lines via the column control circuits 3A, 3B. Each of the writing circuits 5A, 5B has a source circuit such as a current source or a voltage source for generating a write current, and a sink circuit for absorbing the write current.

Furthermore, for example, reading circuits 2A, 2B are connected to the bit lines BL, bBL on one end and the other end via the column control circuits 3A, 3B. Each of the reading circuits 2A, 2B has a voltage source or a current source for generating a read current, a sense amplifier for detecting and amplifying a read signal, and a latch circuit for temporarily retaining data.

The column control circuits 3A, 3B are provided with switch circuits for controlling the state of conduction of the bit lines BL, bBL and the writing circuits 5A, 5B, and switch circuits for controlling the state of conduction of the bit lines BL, bBL and the reading circuits 2A, 2B.

During a write operation, in the column control circuits 3A, 3B, the switch circuits connected to the write target memory cell MC are turned on, and other switch circuits are turned off. Further, the select transistor ST in the selected memory cell MC is turned on by the row control circuit 4. Then, a write current in a direction corresponding to write data is supplied to the selected memory cell MC. During writing of data, one of the writing circuits 5A, 5B serves as a source side and the other serves as a sink side in accordance with the direction of the passage of a current.

A configuration example of the reading circuit of the MRAM and an example of read operation are described in detail below.

(2) Reading Circuit (a) Basic Configuration

Figure 17A:
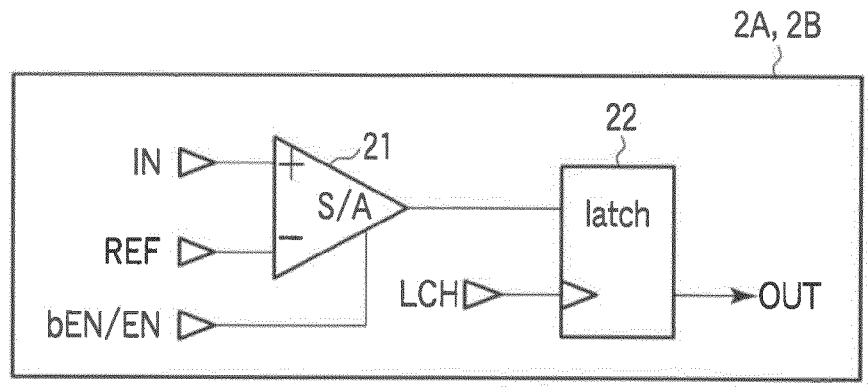
Figure 17B:
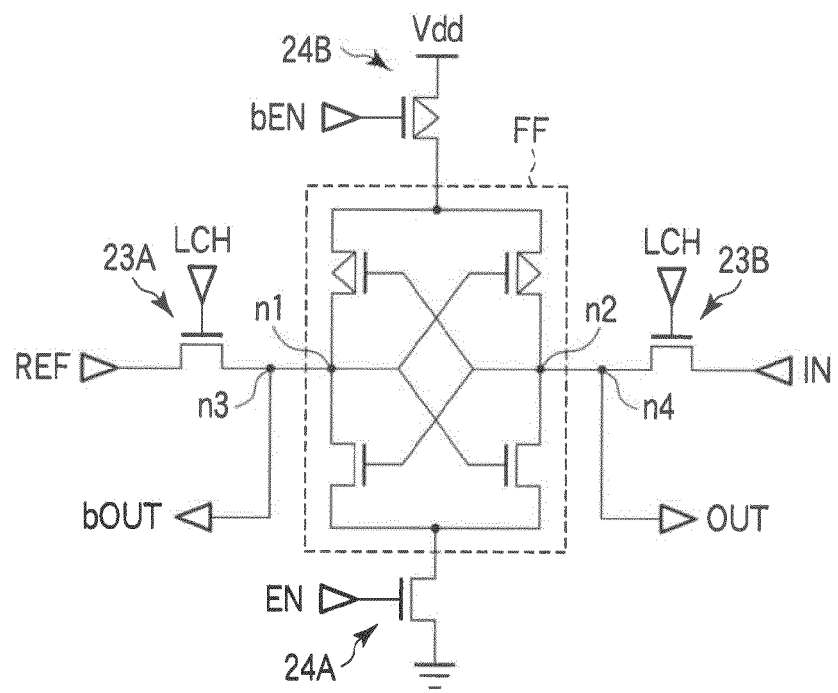

FIGS. 17A and 17B are diagrams showing examples of the configurations of a sense amplifier 21 and a latch circuit 22 provided in the reading circuit 2A, 2B.

As shown in FIG. 17A, the operation of the sense amplifier 21 is controlled by control signals (hereinafter referred to as S/A drive signals) EN, bEN. A reference signal REF and an input signal (read signal) IN are input to two input terminals of the sense amplifier 21, respectively. The read signal IN is the value of the potential of the bit line that varies depending on the MR ratio (data) of the MTJ element when a read current $I_{READ}$ is passed through the MTJ element. The reference signal REF is a referential constant potential for judging the potential level of the read signal.

The output terminal of the sense amplifier 21 is connected to the input terminal of the latch circuit 22.

The operation of the latch circuit 22 is controlled by a control signal (hereinafter referred to as a data loading signal) LCH. The latch circuit 22 temporarily retains the signal output from the sense amplifier 21, and outputs the retained signal as an output signal OUT. The output signal OUT corresponds to data read from the memory cell.

FIG. 17B shows one example of a circuit in which the sense amplifier 21 and the latch circuit 22 are combined together.

In the example shown in FIG. 17B, a flip-flop circuit FF composed of two CMOS inverters is provided. A power supply potential Vdd is supplied to the flip-flop circuit FF via a P-channel field effect transistor (FET) 24B. A control signal bEN is input to the gate of the P-channel FET 24B, and the FET 24B is turned on/off under the control of the control signal bEN.

Furthermore, a ground potential Vss (GND) is supplied to the flip-flop circuit FF via an N-channel FET 24A. A control signal EN is input to the gate of the FET 24A, and the FET 24A is turned on/off under the control of the control signal EN.

The control signal EN and the control signal bEN have a complementary relation. When the control signal EN is at an "H (high)" level, the control signal bEN shows an "L (low)" level. When the control signal EN is at an "L (low)" level, the control signal bEN shows an "H (high)" level.

N-channel FETs 23A, 23B are connected to two nodes, n1, n2 of the flip-flop circuit FF, respectively.

One end of the current path of the N-channel FET 23A is connected to the node n1. The reference signal REF is input to the other end of the current path of the N-channel FET 23A. The data loading signal LCH is input to the gate of the N-channel FET 23A, and the FET 23A is turned on/off under the control of the data loading signal LCH.

One end of the current path of the N-channel FET 23B is connected to the node n2. The read signal IN is input to the other end of the current path of the N-channel FET 23B. The data loading signal LCH is input to the gate of the N-channel FET 23B, and the FET 23B is turned on/off under the control of the data loading signal LCH.

The data loading signal LCH input to the two FETs 23A, 23B have the same signal level, and are thus input to the FETs 23A, 23B.

A node n3 is provided between the node n1 and the FET 23A, and an output terminal bOUT is connected to the node n3. Moreover, a node n4 is provided between the node n2 and the FET 23B, and an output terminal OUT is connected to the node n4.

The reference signal REF is input to the node n1 via the N-channel FET 23A. The read signal IN is input to the node n2 via the N-channel FET 23B.

The input read signal IN and reference signal REF are amplified and latched by the flip-flop circuit FF.

(b) Configuration Example 1

Circuit Configuration

Figure 18:
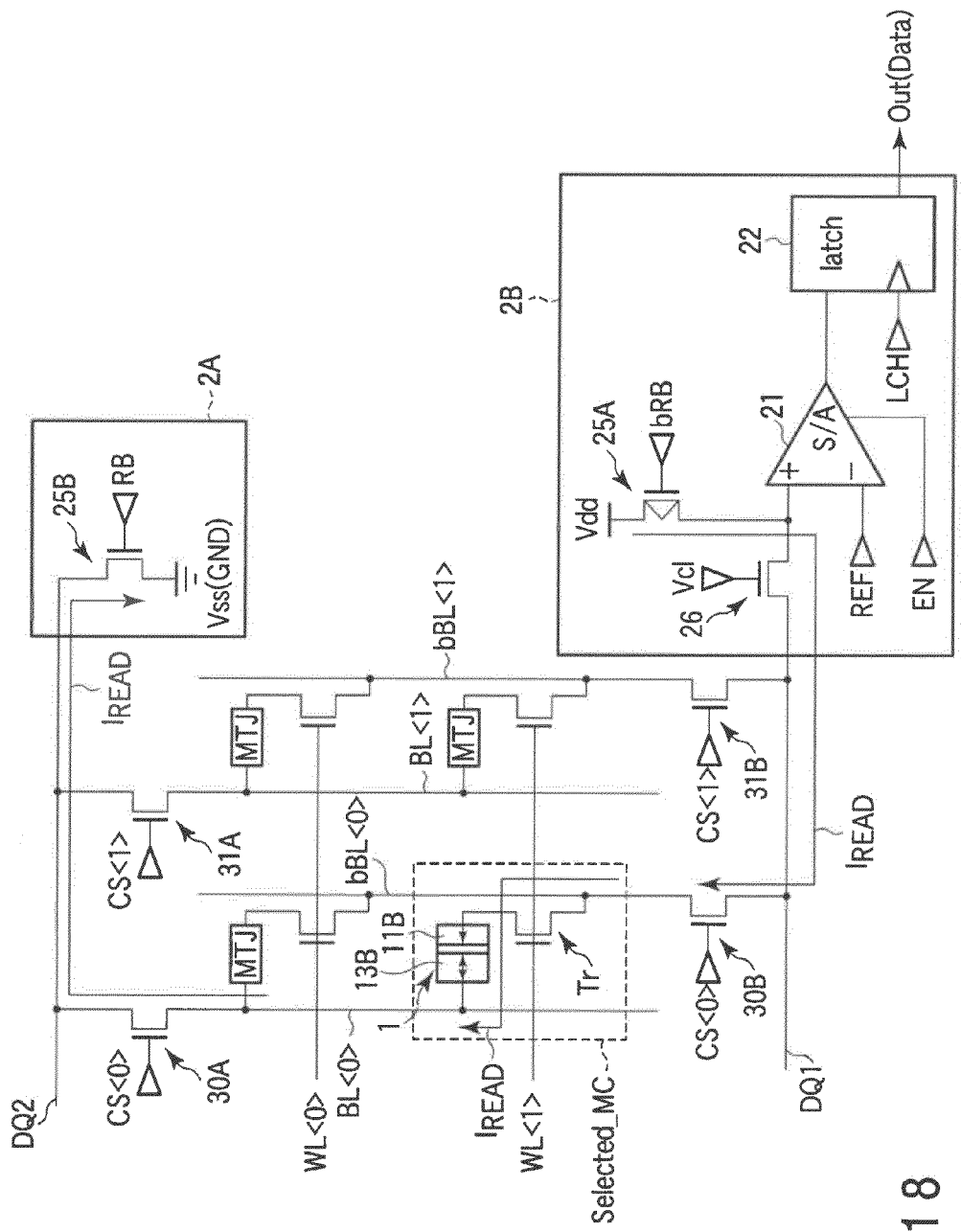
Figure 20:
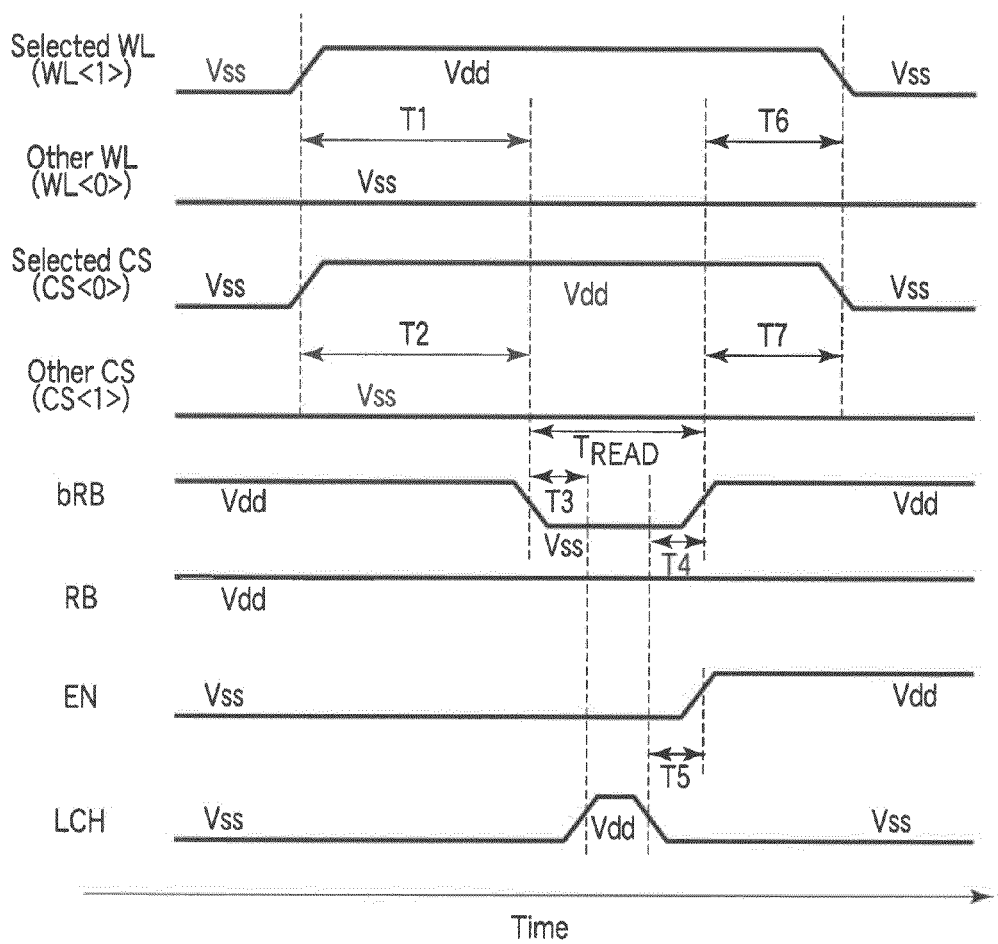
FIG. 20 is a waveform chart showing read operation of the memory shown in FIG. 18 and FIG. 19.

An example of the reading circuit used in the MRAM according to the present application and an example of a read operation are described with FIG. 18 to FIG. 20. Here, components necessary to explain the reading circuit and the read operation are extracted and explained, while other components are neither shown nor explained. The same components as the components described with FIG. 15 to FIG. 17 are provided with the same numerals and are described when necessary.

FIG. 18 and FIG. 19 are schematic diagrams showing the components to explain the reading circuit in the MRAM according to the present application and the read operation. In FIG. 18 and FIG. 19, a 2×2 memory cell array in which four memory cells are arranged in a matrix form along the row direction and the column direction is shown for ease of explanation.

In the case described below, a memory cell Selected_MC enclosed by a broken line in FIG. 18 and FIG. 19 is selected, and data stored in the MTJ element within this memory cell (hereinafter referred to as a selected cell) is read.

Four bit lines BL<0>, bBL<0>, BL<1>, bBL<1> are provided in the memory cell array. The two bit lines BL<0>, bBL<0> form one bit line pair. Similarly, the two bit lines BL<1>, bBL<1> form one bit line pair. Moreover, two word lines WL<0>, WL<1> are provided in the memory cell array.

The selected cell Selected_MC is connected between the bit line pairs BL<0>, bBL<0>. One end of the MTJ element 1 is connected to the bit line BL<0>. The other end of the MTJ element 1 is connected to one end of the current path of the select transistor Tr. The other end of the current path of the select transistor Tr is connected to the bit line bBL<0>.

In the example shown in FIG. 18 and FIG. 19, a storage layer 13B of the MTJ element 1 is connected to the bit line BL<0>, and a referential layer 11B of the MTJ element 1 is connected to the bit line bBL<0> via the select transistor Tr. In addition, the MTJ element 1 may be a perpendicular magnetization type or in-plane magnetization type. Moreover, the connection of the referential layer/storage layer to the bit line may be opposite to the connection in the example shown in FIG. 18 and FIG. 19.

The word line WL<1> is connected to the gate of the select transistor Tr in the selected cell Selected_MC. That is, the word line WL<1> is a word line that has been selected (hereinafter referred to as a selected word line). The other word line WL<0> is an unselected word line.

The reading circuit 2A is connected to the bit lines BL<0>, BL<1> via column control switches (e.g., FETs) 30A, 31A. The reading circuit 2B is connected to the bit lines bBL<0>, bBL<1> via column control switches 30B, 31B.

The column control switches 30A, 30B, 31A, 31B are provided in the column control circuits 3A, 3B.

The column control switches 30A, 30B connected to the bit line pairs BL<0>, bBL<0> on one end and the other end are operated (turned on/off) under the control of column control signals CS<0>. The column control signals CS<0> of the same level are input to the column control switch 30A and the column control switch 30B.

The column control switches 31A, 31B connected to both ends of the bit line pairs BL<1>, bBL<1> are operated (turned on/off) under the control of column control signals CS<1>. The column control signals CS<1> of the same level are input to the column control switch 31A and the column control switch 31B.

When the column control signal CS<0>, CS<1> is at an "H (high)" level (Vdd level), the column control switch is on. When the column control signal CS<0>, CS<1> is at an "L (low)" level (Vss level), the column control switch is off.

The column control switch connected to the bit line that has been selected (hereinafter referred to as a selected bit line) is turned on, and the column control switches connected to the bit lines other than the selected bit line (hereinafter referred to as unselected bit lines) are turned off.

When the column control switches are turned on, the selected cell Selected_MC and the reading circuits 2A, 2B are electrically connected together.

Here, the selected bit lines are the bit line BL<0> and the bit line bBL<0>, and the column control switches that are turned on are the switch 30A and the switch 30B.

The reading circuit 2A, 2B is provided with a power source (voltage source) Vdd, Vss (GND) for generating a read current $I_{READ}$ and switches 25A, 25B, 26, in addition to the sense amplifier 21 and the latch circuit 22 shown in FIG. 17A or 17B. In FIG. 18 and FIG. 19, the sense amplifier 21 and the latch circuit 22 are provided in one reading circuit 2B. However, the sense amplifiers 21 and the latch circuits 22 may be provided in both the reading circuit 2A and the reading circuit 2B in order to inhibit the reduction of reading sensitivity due to the interconnect length of the bit line.

The switch 25A is, for example, a P-channel field effect transistor (FET). A power supply voltage Vdd is supplied to one end of the current path of the switch 25A. The other end of the current path of the switch 25A is connected to a common interconnect DQ1. The operation of the switch 25A is controlled by a control signal (hereinafter referred to as a read current drive signal) bRB.

The switch 25B is, for example, an N-channel field effect transistor (FET). A ground voltage Vss (GND) is supplied to one end of the current path of the switch 25B. The other end of the current path of the switch 25B is connected to a common interconnect DQ2. The operation of the switch 25B is controlled by a control signal RB.

Although the read current drive signal bRB is described as a signal which is controlled separately from the control signal RB in Configuration Example 1, the read current drive signal bRB and the control signal RB may show signal levels complementary to each other. That is, if these signals show complementary signal levels, the control signal RB shows an inversion signal ("H" level) of the read current drive signal bRB when the read current drive signal bRB is at the "L" level. This enables control whereby the switch 25B that is the N-channel FET is turned on simultaneously with the turning on of the switch 25A that is the P-channel FET.

Although one switch 25A is shown in the reading circuit 2B and one switch 25B is shown in the reading circuit 2A in FIG. 18 and FIG. 19, both the switch 25A and the switch 25B may be provided in each of the reading circuits 2A, 2B and connected to the common interconnects DQ1, DQ2, respectively.

The switch 26 is provided in the reading circuit 2B. The switch 26 is, for example, an N-channel field effect transistor (FET). One end of the current path of the switch 26 is connected to the input terminal of the sense amplifier 21, and the other end of the current path of the switch 26 is connected to the common interconnect DQ1. A control signal Vcl is input to the gate of the switch 26, and the switch 26 is operated (turned on/off) under the control of the signal Vcl. This switch 26 is adjusted so that the potential applied to the MTJ element is at a predetermined value at the time of reading.

As shown in FIG. 18, when the read current $I_{READ}$ is passed from the reading circuit 2B to the reading circuit 2A, the switch 25A in the reading circuit 2B is turned on, and the power supply potential Vdd is supplied to the common interconnect DQ1. Moreover, the switch 25B in the reading circuit 2A is turned on, and the ground voltage Vss is supplied to the common interconnect DQ2. In the example shown in FIG. 18, the read current $I_{READ}$ runs from the reference layer 11B of the MTJ element 1 to the storage layer 13B. It should be appreciated that the movement direction of electrons is opposite to the direction in which the read current $I_{READ}$ runs.

As shown in FIG. 19, when the read current $I_{READ}$ is passed from the reading circuit 2A to the reading circuit 2B, the switch 25A in the reading circuit 2A is turned on, and the power supply potential Vdd is supplied to the common interconnect DQ2. Moreover, the switch 25B in the reading circuit 2B is turned on, and the ground voltage Vss is supplied to the common interconnect DQ1. In the example shown in FIG. 19, the read current $I_{READ}$ is passed from the storage layer 13B of the MTJ element 1 to the reference layer 11B.

Although the read current $I_{READ}$ is generated using the power supply potential (voltage source) Vdd in the examples shown in FIG. 18 and FIG. 19, it goes without saying that, instead of the voltage source, a constant current source may be connected to one end of the current path of the switch 25A to generate the read current $I_{READ}$.

In the MRAM shown in FIG. 18 and FIG. 19, the operations of the switches 25A, 25B are controlled so that the pulse width $T_p$ of the read current $I_{READ}$ generated by the reading circuit 2A, 2B may be shorter than the time before the magnetizations in the storage layer 13b start a coherent precession movement. More specifically, the pulse width $T_p$ of the read current $I_{READ}$ is set and controlled to satisfy the conditions shown in (Expression 17) to (Expression 20).

(Operation)

The read operation of the circuit (MRAM) shown in FIG. 18 and FIG. 19 is described with FIG. 20. FIG. 20 shows a timing chart of the read operation of the circuit shown in FIG. 18 and FIG. 19. Here, FIG. 18 and FIG. 19 are also used. In the circuit shown in FIG. 18 and FIG. 19, the direction of the read current running through the MTJ element is different, but the operation of the circuit is substantially the same. In addition, as described above, the selected cell targeted for reading is the cell Selected_MC enclosed by the broken line in FIG. 18 and FIG. 19. The selected word line is the word line WL<1>, and the selected bit lines are the bit line BL<0> and the bit line bBL<0>.

First, a potential Vdd ("H" level) is supplied to the selected word line WL<1>, and the selected word line WL<1> is activated. At the same time, the potential of a column control signal Selected CS (here, CS<0>) for the selected bit lines BL<0>, bBL<0> is shifted from a potential Vss ("L" level) to a potential Vdd ("H" level). Thus, the column control switches 30A, 30B connected to the bit lines BL<0>, bBL<0> are turned on, and the bit lines BL<0>, bBL<0> are activated. However, the selected word line WL<1> and the selected bit lines BL<0>, bBL<0> may not be activated at the same time.

In addition, during the reading of the selected cell, the control signal Vcl of the switch 26 is set at a constant signal level (potential), and turned on. Moreover, during the reading, the potential Vss is supplied to the unselected word line WL<0>, and the potential Vss is supplied to the unselected bit line corresponding to a column control signal OtherCS (here, CS<1>). That is, the unselected word line WL<0> and the unselected bit lines BL<1>, bBL<1> are deactivated during the read operation.

After predetermined periods T1, T2 have passed since the activation of the selected word line WL<1> and the selected bit lines BL<0>, bBL<0>, the level of the read current drive signal bRB is shifted from the potential Vdd to the potential Vss. Thus, the switch (P-channel FET) 25A controlled by the read current drive signal bRB is turned on, and the potential Vdd is supplied to the bit line bBL<0> (or BL<0>). Further, during the read operation, the level of the control signal RB, for example, is set at the constant potential Vdd, and the switch (N-channel FET) 25B is turned on. Thus, the potential Vss is applied to the bit line BL<0> (or bBL<0>). In addition, as described above, the control signal RB may be an inversion signal of the read current drive signal bRB. In this case, in the read operation, the level of the control signal RB is set at the constant potential Vdd, and the level of the read current drive signal bRB is set at the constant potential Vss.

Consequently, the read current $I_{READ}$ is supplied to the MTJ element 1 in the selected cell Selected_MC.

After a predetermined period T3 has passed since the shift of the level of the read current drive signal bRB to the potential Vss, the level of the data loading signal LCH is shifted from the potential Vss to the potential Vdd.

Thus, after the read current drive signal bRB is driven and the read current $I_{READ}$ is then output, the data loading signal LCH is driven and the latch circuit 22 is then turned on. The reason for doing this is to prevent the latch circuit 22 from erroneously loading, as data, a potential variation of the bit line caused by the passage of the read current $I_{READ}$ through the MTJ element 1, that is, an insufficient read signal that has not become a signal sufficiently reflecting the resistance state (MR ratio) of the MTJ element 1.

After a predetermined period, the level of the data loading signal LCH is changed from the potential Vdd to the potential Vss, and the latch circuit 22 stops loading the data.

Subsequently, after a period T4, the level of the read current drive signal bRB is changed from the potential Vss to the potential Vdd. The read current $I_{READ}$ is supplied to the MTJ element in the selected cell during a period $T_{READ}$ in which the level of the read current drive signal bRB is at the potential Vss.

The reason why the supply of the read current $I_{READ}$ is stopped after the latch circuit 22 is stopped is to prevent the latch circuit 22 from loading erroneous data, as in the case previously described.

After a predetermined period T5 has passed since the shift of the level of the data loading signal LCH to the potential Vss, the level of the S/A drive signal EN is changed from the potential Vss to the potential Vdd. Thus, the sense amplifier 21 is driven, and the sense amplifier 21 compares the read signal (input signal) IN with the reference signal REF to detect the potential variation of the bit line corresponding to the resistance state (MR ratio) of the MTJ element 1. After the latch circuit 22 is stopped, the sense amplifier 21 is driven so that the sense amplifier 21 can rapidly amplify the varying potentials (data) of the bit lines BL<0>, bBL<0>.

Here, the operations of the sense amplifier 21 and the latch circuit 22 are more specifically described with FIGS. 17A and 17B.

While the read current $I_{READ}$ is supplied to the MTJ element 1 in the selected cell Selected_MC, the sense amplifier 21 detects, as the read signals IN, the potentials of the bit lines BL<0>, bBL<1> influenced by the MR ratio of the MTJ element 1. The sense amplifier 21 outputs, to the latch circuit 22, the result of comparison (potential difference) between the detected read signal IN and the reference signal REF. The latch circuit 22 retains the output of the sense amplifier 21, and outputs the same to the outside as data.

In FIG. 17B, the read current $I_{READ}$ is output, and when the potential difference between the read signal IN to be input to the sense amplifier 21 and the reference signal REF reaches a sufficient value (size) for detection, the potentials corresponding to the read signal IN and the reference signal REF are transferred to outputs OUT, bOUT, respectively, if the level of the data loading signal LCH is at the "H (Vdd)" level.

Subsequently, even if the data loading signal LCH is shifted from the "H" level to the "L (Vss)" level, the potentials of the output terminals OUT, bOUT are maintained by the capacities (stored charge) present in the output terminals OUT, bOUT (nodes n3, n4).

The S/A drive signal EN is changed to the "H" level and the control signal bEN complementary thereto is set at the "L" level while the potentials of the output terminals OUT, bOUT are being maintained, so that the potentials of the output terminals OUT, bOUT are amplified to the level of the potential Vdd and the level of the potential Vss, respectively. In addition, the output terminals OUT, bOUT are preferably equal in capacity for faster amplification of the potential levels.

After a predetermined period T6 has passed since the shift of the level of the read current drive signal bRB to the potential Vdd, the signal level of the selected word line WL<1> is changed from the potential Vdd to the potential Vss, and the selected word line WL<1> is deactivated.

After a predetermined period T7 has passed since the shift of the level of the read current drive signal bRB to the potential Vss, the level of the selected column control signal CS<0> is changed from the potential Vdd to the potential Vss, and the selected bit lines BL<0>, bBL<0> are deactivated. Thus, the selected cell Selected_MC and the reading circuits 2A, 2B are electrically disconnected.

The read operation of the MRAM ends at this point.

As described above, the read current $I_{READ}$ is supplied to the MTJ element during the period $T_{READ}$ in which the level of the signal bRB is the potential Vss. Therefore, the period $T_{READ}$ is shorter than the time (period) before the magnetizations in the storage layer 13b make a coherent precession movement. More specifically, the period $T_{READ}$ is set at the magnetization inversion time (switching time) $t_{sw}$ that satisfies (Expression 17) to (Expression 20).

As a result, the read current $I_{READ}$ having a pulse width $T_p$ equal to or less than the magnetization inversion time $t_{sw}$ can be supplied to the MTJ element in the selected cell.

Consequently, according to Configuration Example 1, an MRAM with reduced read disturb can be provided.

(c) Configuration Example 2

Circuit Configuration

Figure 22:
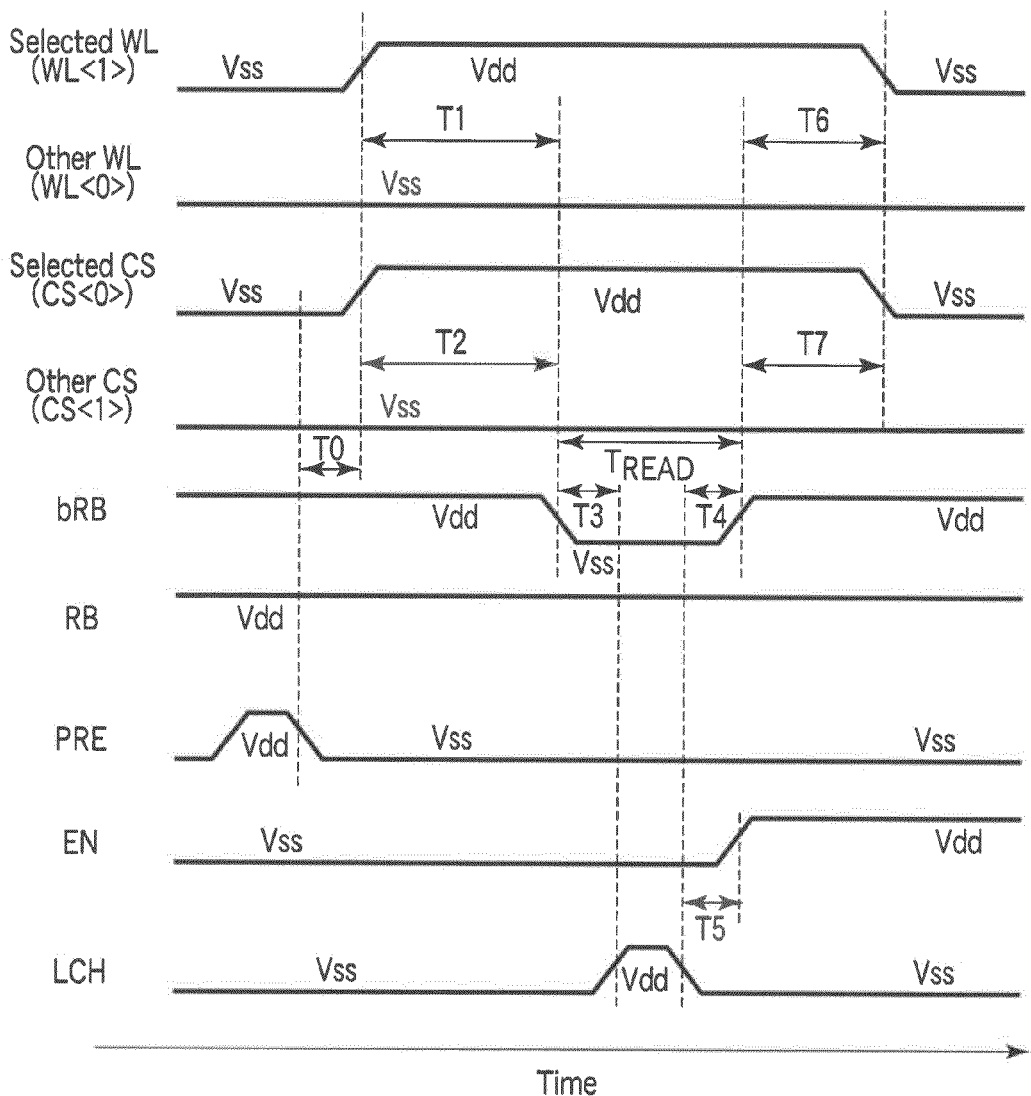
FIG. 22 is a waveform chart showing a read operation of the memory shown in FIG. 21.

Configuration Example 2 of the MRAM which is an application of the present embodiment is described with FIG. 21 and FIG. 22. Here, the difference between Configuration Example 1 and Configuration Example 2 is mainly described, and common components are described when necessary.

The MRAM shown in FIG. 21 is different from the MRAM shown in FIG. 18 and FIG. 19 in that it further comprises precharge circuits 29A to 29C.

The precharge circuits 29A to 29C are provided in, for example, column control circuits 3A, 3B or reading circuits 2A, 2B.

As shown in FIG. 21, the precharge circuits 29A to 29C are connected to a common interconnect DQ1 and bit lines bBL<0>, bBL<1>. Each of the precharge circuits 29A to 29C includes a switch and a power source Vpre. The switch is, for example, an N-channel FET. One end of the current path of the switch is connected to the power source Vpre, and the other end of the current path of the switch is connected to the bit line bBL<0>, bBL<1> or the common interconnect DQ1. A precharge drive signal PRE is input to the gate of the switch. The switches in the precharge circuits 29A to 29C are operated (turned on/off) under the control of the drive signal PRE, and the precharging of interconnects is controlled.

The intensity of a potential (hereinafter referred to as a precharge potential) Vpre used for the precharging is set at the same intensity (e.g., the potential Vdd) as the potential applied to the bit lines/common interconnect by a read current $I_{READ}$ and a potential supplied to a switch 26.

When a read operation is performed, the precharge circuits 29A to 29C apply the precharge potential Vpre to the common interconnect DQ1 and the bit lines bBL<0>, bBL<1> in advance before the read current $I_{READ}$ is supplied to the MTJ element. In addition, in the read operation, the bit lines to be precharged are the bit lines and common interconnect to be set at high potentials, and the bit lines to be set at low potentials (Vss) are not precharged. Moreover, unselected bit lines may not be precharged.

FIG. 22 is a timing chart showing the read operation of the MRAM shown in FIG. 21.

As shown in FIG. 22, in Configuration Example 2, first, the level of the precharge drive signal PRE is changed from a potential Vss to a potential Vdd, and the precharge circuits 29A to 29C are driven. Thus, the precharge potential Vpre is applied to the bit lines and common interconnect.

After a predetermined period has passed, the level of the precharge drive signal PRE is changed from the potential Vdd to the potential Vss, and the switches in the precharge circuits 29A to 29C are turned off. As a result, the precharge circuits 29A to 29C are electrically disconnected from the interconnects, and the precharging of the interconnects is finished.

After a predetermined period T0 has passed since the shift of the level of the precharge drive signal PRE to the potential Vss, the potential Vdd is supplied to the selected word line WL<1>, and the signal level of a column control signal CS<0> is changed to the potential Vdd. As a result, the selected word line WL<1> and the selected bit lines BL<0>, bBL<0> are activated. The subsequent operation is similar to the operation shown in FIG. 20.

Thus, the precharge circuits 29A to 29C supply the precharge potential Vpre to the bit lines and the common interconnect before the selected word line WL<1> and the selected bit lines BL<0>, bBL<0> are activated, thereby precharging the interconnects.

In the MRAM shown in FIG. 18 and FIG. 19, the bit lines and the common interconnect are charged by the read current $I_{READ}$ and the potential supplied to the switch 26. In this case, the start of the charging of the interconnects is substantially simultaneous with the start of the supply of the read current, so that the time required for the value of the read current $I_{READ}$ to reach a predetermined value is increased due to the response speed of the read current drive signal bRB (switch 25A) and the interconnect capacities of the bit lines/the common interconnect. That is, a period $t_1$ to $t_2$ for the rising of the read current shown in FIG. 1B is increased, and the pulse width $T_p$ of the read current $I_{READ}$ is increased.

On the other hand, as shown in FIG. 21, the precharge circuits 29A to 29C precharge the bit lines and the common interconnect, so that the charge (electron) amount of the read current that charges the parasitic capacities of the bit lines and the common interconnect is decreased in the rising time $t_1$ to $t_2$ of the read current $I_{READ}$. As a result, the effect of interconnect delay can be reduced, and the read operation can be performed using the read current $I_{READ}$ having a shorter pulse width $T_p$.

Figure 23:
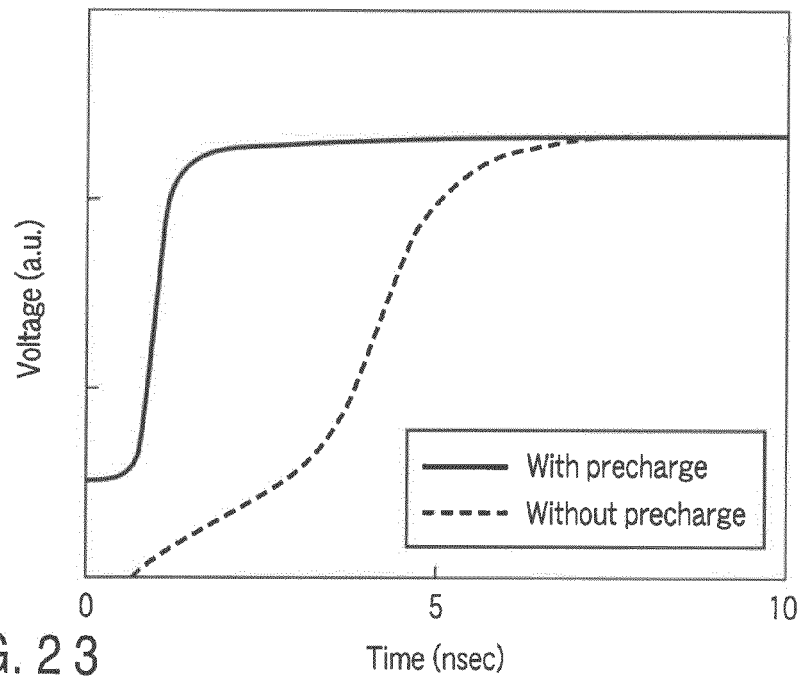
FIG. 23 is a graph showing the change of a read voltage with time when an interconnect is precharged.

FIG. 23 shows the result of a simulation of the change of a read signal with time, wherein the interconnect capacity of the bit line is set at 200 fF, and the sum of the resistance values of the MTJ element 1 and the select transistor Tr is set at 15 kgΩ. The horizontal axis in FIG. 23 indicates time (unit: nsec). The vertical axis in FIG. 23 indicates a voltage (unit: a.u.) corresponding to the read signal. As shown in FIG. 23, when there is no precharging, about 7 nsec is required for the read signal to rise and then be saturated. On the other hand, when interconnects are precharged as in this example, the read signal reaches a predetermined level in about 2 nsec.

Thus, the time of the precharging of interconnects is decreased, and data stored in the MTJ element in the selected cell can be rapidly read. Moreover, as the effect of the interconnect capacity is reduced, the pulse width $T_p$ of the read current can be smaller. Further, as the variation of the pulse width $T_p$ resulting from the interconnects is decreased, the MRAM operates stably.

Consequently, according to the MRAM in Configuration Example 2 shown in FIG. 21, read disturb can be reduced, and the precharge circuits 29A to 29C are further provided to enable faster read operation.

Figure 24:
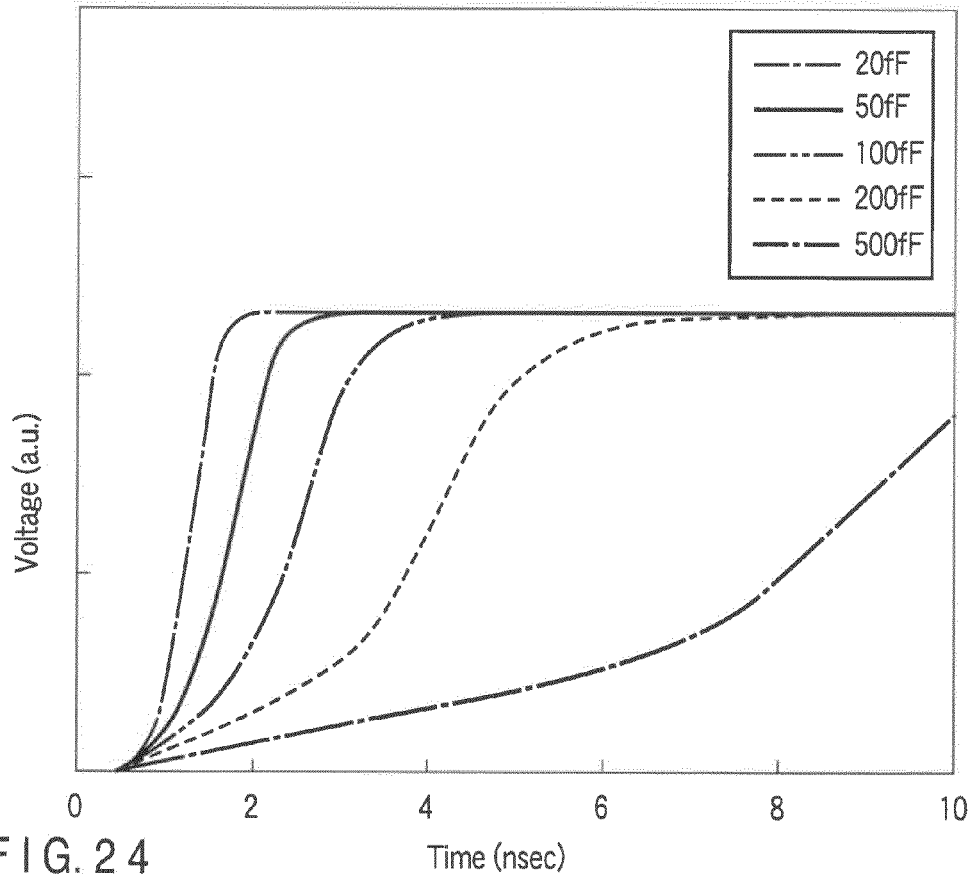
FIG. 24 is a graph illustrating the correlation between a time and a voltage.
Figure 25:
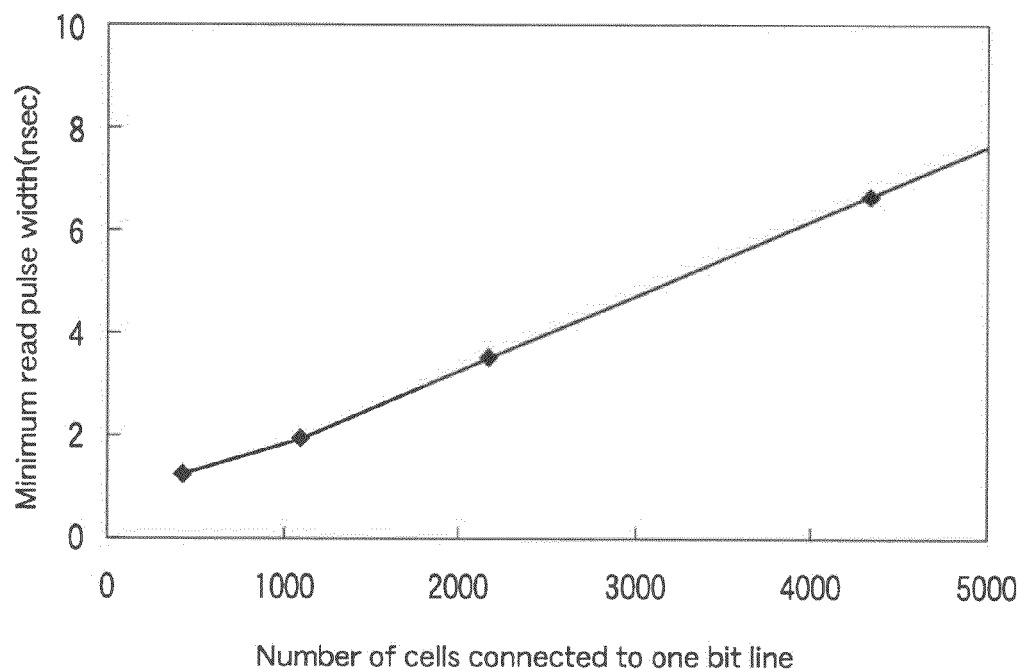
FIG. 25 is a graph illustrating the correlation between the read current and the number of memory cells.

(d) Influence of the Number of Memory Cells on the Read Current The influence of the number of memory cells connected to a bit line on the read current is considered using FIG. 24 and FIG. 25.

When a large-scale memory cell array as in the MRAM shown in FIG. 15 is configured, how much the pulse width $T_p$ of the read current $I_{READ}$ can be reduced is affected by the intensity of the read signal detected by the sense amplifier 21 and the delay time $t_1$ to $t_2$ for the rising of the read current $I_{READ}$ shown in FIG. 1B.

For example, the sense amplifier 21 detects a larger read signal correlatively with how high the MR ratio of the MTJ element 1 is. For example, when the resistance value of the MTJ element is several kΩ, an MR ratio equal to or more than 100% is desirably obtained.

Furthermore, the rising time $t_1$ to $t_2$ of the pulse of the read current $I_{READ}$ is affected by the resistance values and capacities of interconnects through which the read current $I_{READ}$ runs, such as the bit lines and the common interconnect.

However, the resistance values of the bit lines and the common interconnect are sufficiently lower than the resistance values of the MTJ element 1 and the select transistor Tr that constitute the memory cell MC. Therefore, an inspection is carried out here on the assumption that the resistance value of the interconnect is substantially 0 taking into account the resistance values of the MTJ element 1 and the select transistor in the interconnect path through which the read current $I_{READ}$ runs.

FIG. 24 shows the result of a simulation of the change, with time, of a voltage (read signal) generated by the read current $I_{READ}$, wherein the sum of the resistance values of the MTJ element 1 and the select transistor Tr is 15 kΩ. The horizontal axis in FIG. 24 indicates time (unit: nsec). The vertical axis in FIG. 24 indicates voltage (unit: a.u.). In the simulation shown in FIG. 24, the interconnect capacities of the bit lines BL are set at 20 fF, 50 fF, 100 fF, 200 fF and 500 fF. In addition, in FIG. 24, the rising time of the read current drive signal bRB is set at 1 nsec.

As shown in FIG. 24, when the interconnect capacitance is higher, the rising time of the voltage (read current) is longer. This means that the minimum pulse width that permits reading of data is regulated by the interconnect capacity of, for example, the bit line.

The interconnect capacity depends on, for example, the length and width of the interconnect, and the distance between adjacent interconnects. For example, the width of the interconnect is 100 nm, the space between adjacent interconnects is 100 nm, and the thickness of an interlayer insulating film using silicon oxide is 2000 nm. In this case, the interconnect capacity for an interconnect length of 1 μm is about 0.2 fF.

FIG. 25 shows the relation between the number of memory cells connected to one bit line and the minimum pulse width of the read current $I_{READ}$. The horizontal axis in FIG. 25 indicates the number of memory cells connected to one bit line. The vertical axis in FIG. 25 indicates the minimum pulse width of the read current. In FIG. 25, an inspection is carried out wherein the size (dimension) of one memory cell (see FIG. 16) in the bit line extending direction is set at 200 nm. Here, if a characteristic line curves to reach saturation within a given range of the pulse width in FIG. 23, data can be normally read using a read current having this pulse width.

The pulse width $T_p$ of the read current needs to be equal to or less than the value indicated by a full line in FIG. 25 in accordance with the number of memory cells connected to the bit line.

Judging from the tendency shown in FIG. 25, the pulse width $T_p$ of the read current $I_{READ}$ can be equal to or less than 8 nsec if the number of memory cells connected to one bit line BL is 500 or less.

Thus, when an MRAM having a large-scale memory cell array is configured, the pulse width $T_p$ of the read current can be set by taking the number of memory cells into consideration.

Consequently, according to the embodiment of the present invention, a magnetoresistive effect memory with reduced read disturb can be provided.

[Others]

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetoresistive effect memory comprising:
a magnetoresistive effect element including a first magnetic layer having an invariable magnetization direction, a second magnetic layer having a variable magnetization direction, and an interlayer provided between the first magnetic layer and the second magnetic layer, a magnetization of the second magnetic layer including spins of magnetic particles included in the second magnetic layer; and
a reading circuit which passes a pulse-shaped read current through the magnetoresistive effect element to read data stored in the magnetoresistive effect element,
wherein the pulse width of the read current is shorter than a period from an initial state in which a precession movement of the spins of the magnetic particles included in the second magnetic layer is not in phase to a cooperative coherent precession movement of the spins of the magnetic particles included in the second magnetic layer.

2. The memory according to claim 1, wherein the reading circuit includes:
a sense amplifier which amplifies a read signal corresponding to the data stored in the magnetoresistive effect element; and
a latch circuit which retains the read signal amplified by the sense amplifier,
wherein the sense amplifier amplifies the read signal after the latch circuit is turned off.

3. The memory according to claim 2, wherein the reading circuit includes:
a first switch element which is connected to the magnetoresistive effect element and which is turned on when the read current is output,
wherein the latch circuit is turned on after the first switch element is turned on.

4. The memory according to claim 1, wherein the reading circuit includes:
a flip-flop circuit provided with first and second nodes;
a first transistor provided with a first terminal connected to the first node, a second terminal to which a reference signal is input, and a first gate to which a first control signal is input;
a second transistor provided with a third terminal connected to the second node, a fourth terminal to which a read signal corresponding to the data stored in the magnetoresistive effect element is input, and a second gate to which a second control signal is input;
a first output terminal connected to the first node; and
a second output terminal connected to second node,
wherein the read signal is input to the flip-flop circuit via a current path of the second transistor after the first and second transistors are turned on by the first and second control signals and is amplified by the flip-flop circuit.

5. The memory according to claim 1, further comprising:
a precharge circuit which charges an interconnect connecting the magnetoresistive effect element and the reading circuit before the read current is passed through the magnetoresistive effect element.

6. The memory according to claim 1, wherein
in the case where the density of the read current is 0.9 times or less of a predetermined current density and the pulse width of the read current is 8 nsec or less,
the predetermined current density has 0.5 of the magnetization inversion probability of the magnetoresistive effect element when a current having a pulse width of 10 nsec is used to write data into the magnetoresistive effect element.

7. A magnetoresistive effect memory comprising:
a magnetoresistive effect element including a first magnetic layer having an invariable magnetization, a second magnetic layer having a variable magnetization, and an interlayer provided between the first magnetic layer and the second magnetic layer; and
a reading circuit which passes a pulse-shaped read current through the magnetoresistive effect element to identify data stored in the magnetoresistive effect element,
wherein the density of the read current is 0.9 times or less of a predetermined current density and the pulse width of the read current is 8 nsec or less, the predetermined current density has 0.5 of the magnetization inversion probability of the magnetoresistive effect element when a current having a pulse width of 10 nsec is used to write data into the magnetoresistive effect element.

8. The memory according to claim 7, wherein the reading circuit includes:
a sense amplifier which amplifies a read signal corresponding to the data stored in the magnetoresistive effect element; and
a latch circuit which retains the read signal amplified by the sense amplifier,
wherein the sense amplifier amplifies the read signal after the latch circuit is turned off.

9. The memory according to claim 8, wherein
the reading circuit includes:
a first switch element which is connected to the magnetoresistive effect element and which is turned on when the read current is output,
wherein the latch circuit is turned on after the first switch element is turned on.

10. The memory according to claim 7, wherein
the reading circuit includes:
a flip-flop circuit provided with first and second nodes;
a first transistor provided with a first terminal connected to the first node, a second terminal to which a reference signal is input, and a first gate to which a first control signal is input;
a second transistor provided with a third terminal connected to the second node, a fourth terminal to which a read signal corresponding to the data stored in the magnetoresistive effect element is input, and a second gate to which a second control signal is input;
a first output terminal connected to the first node; and
a second output terminal connected to the second node,
wherein the read signal is input to the flip-flop circuit via a current path of the second transistor after the first and second transistors are turned on by the first and second control signals and is amplified by the flip-flop circuit.

11. The memory according to claim 7, further comprising:
a precharge circuit which charges an interconnect connecting the magnetoresistive effect element and the reading circuit before the read current is passed through the magnetoresistive effect element.

12. A magnetoresistive effect memory comprising:
a magnetoresistive effect element including a first magnetic layer having an invariable magnetization, a second magnetic layer having a variable magnetization, and an interlayer provided between the first magnetic layer and the second magnetic layer; and
a reading circuit which passes a pulse-shaped read current through the magnetoresistive effect element to identify data stored in the magnetoresistive effect element,
wherein a pulse width Tp satisfies Conditional expression (i):

$$T_p \leq \frac{A}{\frac{J_{read}}{J_c(10 \text{ nsec, midpoint})} - B} \quad (i)$$

where Tp is the pulse width of the read current, $J_{dread}$ is the density of the read current, $J_C$ (10 ns, midpoint) is a predetermined current density, A is a first value using a read disturb occurrence probability as a parameter, and B is a second value using the read disturb occurrence probability as a parameter,
the predetermined current density has 0.5 of the magnetization inversion probability of the magnetoresistive effect element when a current having a pulse width of 10 nsec is used to write data into the magnetoresistive effect element.

13. The memory according to claim 12, wherein
the first value A satisfies Conditional expression (ii):

$$A = 0.0296 Ln(q) + 3.188 \quad (ii)$$

where q is the read disturb occurrence probability.

14. The memory according to claim 12, wherein the first value A satisfies Conditional expression (iii):

$$A = \left(1.7 \times 10^{-5} \times \frac{Ms}{\alpha_{damp}} + 0.15\right) \times (0.0296 \text{ Ln}(q) + 3.188) \quad (iii)$$

where q is the read disturb occurrence probability, $\alpha_{damp}$ is the damping constant of the second magnetic layer, and Ms is the saturation magnetization of the second magnetic layer.

15. The memory according to claim 12, wherein
the second value B satisfies Conditional expression (iv):

$$B = 0.0116 Ln(q) + 0.591 \quad (iv)$$

where q is the read disturb occurrence probability.

16. The memory according to claim 12, wherein
the reading circuit includes:
a sense amplifier which amplifies a read signal corresponding to the data stored in the magnetoresistive effect element; and
a latch circuit which retains the read signal amplified by the sense amplifier,
wherein the sense amplifier amplifies the read signal after the latch circuit is turned off.

17. The memory according to claim 16, wherein
the reading circuit includes:
a first switch element which is connected to the magnetoresistive effect element and which is turned on when the read current is output,
wherein the latch circuit is turned on after the first switch element is turned on.

18. The memory according to claim 12, wherein
the reading circuit includes:
a flip-flop circuit provided with first and second nodes;
a first transistor provided with a first terminal connected to the first node, a second terminal to which a reference signal is input, and a first gate to which a first control signal is input;
a second transistor provided with a third terminal connected to the second node, a fourth terminal to which a read signal corresponding to the data stored in the magnetoresistive effect element is input, and a second gate to which a second control signal is input;
a first output terminal connected to the first node; and
a second output terminal connected to the second node,
wherein the read signal is input to the flip-flop circuit via a current path of the second transistor after the first and second transistors are turned on by the first and second control signals and is amplified by the flip-flop circuit.

19. The memory according to claim 12, further comprising:
a precharge circuit which charges an interconnect connecting the magnetoresistive effect element and the reading circuit before the read current is passed through the magnetoresistive effect element.

* * * * *